(12) United States Patent
Nakauchi et al.

(10) Patent No.: US 6,859,264 B2
(45) Date of Patent: Feb. 22, 2005

(54) PROJECTION EXPOSURE APPARATUS HAVING ABERRATION MEASUREMENT DEVICE

(75) Inventors: Akihiro Nakauchi, Tochigi (JP); Ryuichi Sato, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 143 days.

(21) Appl. No.: 09/845,297

(22) Filed: May 1, 2001

(65) Prior Publication Data

US 2002/0024643 A1 Feb. 28, 2002

(30) Foreign Application Priority Data

| May 2, 2000 | (JP) | ................................. 2000-133597 |
| May 31, 2000 | (JP) | ................................. 2000-162066 |
| Jul. 13, 2000 | (JP) | ................................. 2000-213089 |
| Apr. 27, 2001 | (JP) | ................................. 2001-131189 |

(51) Int. Cl.[7] .................. G03B 27/74; G03B 27/54; G03B 27/42
(52) U.S. Cl. .......................... 355/68; 355/67
(58) Field of Search .................... 355/52, 53, 67, 355/68, 69, 70, 71; 356/399, 400, 401; 430/5, 30

(56) References Cited

U.S. PATENT DOCUMENTS

| 4,701,606 A | * | 10/1987 | Tanimoto et al. | ......... 250/201.4 |
| 5,774,205 A | | 6/1998 | Sato | ............................. 355/67 |
| 5,861,944 A | * | 1/1999 | Nishi | .......................... 355/68 |
| 5,973,316 A | | 10/1999 | Ebbesen et al. | ............. 250/216 |
| 6,278,514 B1 | * | 8/2001 | Ohsaki | ......................... 355/53 |
| 6,333,776 B1 | * | 12/2001 | Taniguchi | ..................... 355/52 |
| 6,414,743 B1 | * | 7/2002 | Nishi et al. | .................... 355/69 |
| 6,456,377 B1 | * | 9/2002 | Suzuki et al. | ................ 356/399 |

FOREIGN PATENT DOCUMENTS

JP      11-072607      3/1999

WO      WO98/48451      * 10/1998

OTHER PUBLICATIONS

Flanders, D.C. and Henry I. Smith. "A new interferometric alignment technique," *Appli d Physics Letters*, vol. 31, No. 7, Oct. 1997. Pp. 426–428.

Roychoudhuri, C. "Chapter 6: Multiple–Beam Interferometers," *Optical Shop Testing, Second Edition*, Ed. by Daniel Malacara, John Wiley & Sons: 1992. Pp. 207–245.

Born, Max and Emill Wolf. "Chapter V," *Principles of Optics, 6th Edition*. Pergamon Press, 1993, pp. 203–207.

*Optical Shop Testing*, ed. by Daniel Malacara. "Chapter 8. Foucault, Wire, and Phase Modulation Tests," by J. Ojeda–Castañeda, and "Chapter 9. Ronchi Test" by A. Cornejo–Rodriguez, 1978: John Wiley and Sons, New York. pp. 231–322.

* cited by examiner

*Primary Examiner*—Alan Mathews
(74) *Attorney, Agent, or Firm*—Fitzpatrick, Cella, Harper & Scinto

(57) ABSTRACT

A projection exposure apparatus includes a projection optical system arranged to project a pattern onto a substrate, a holding portion arranged to hold an optical element which propagates light toward the projection optical system, a mask having a transmission portion and being disposed on or near an image plane or object plane of the projection optical system or a plane conjugate to the image plane and the object plane, an actuator arranged to drive the mask along a plane of an image of the optical element formed by the projection optical system, and a measurement device arranged to measure an intensity of light while the mask is driven. The light emerges from the optical element, and passes through the projection optical system and the transmission portion of the mask. The measurement device includes a measurement surface positioned at a plane conjugate to a pupil plane of the projection optical system or a plane spaced apart from the mask enough to separately detect respective rays emerging from plural points of the pupil plane and passing through the transmission portion.

55 Claims, 31 Drawing Sheets

FIG. 15

$$\varepsilon = \left(1+\frac{\Delta R}{R}\right)\cdot\frac{R}{H_0}\cdot\frac{\partial \Phi}{\partial x} = \left(1+\frac{\Delta R}{R}\right)\cdot\frac{1}{NA_0}\cdot\frac{\partial \Phi}{\partial x} \quad \cdots\cdots (3)$$

$$\eta = \left(1+\frac{\Delta R}{R}\right)\cdot\frac{R}{H_0}\cdot\frac{\partial \Phi}{\partial y} = \left(1+\frac{\Delta R}{R}\right)\cdot\frac{1}{NA_0}\cdot\frac{\partial \Phi}{\partial y} \quad \cdots\cdots (4)$$

$$\alpha = \left(1+\frac{\Delta L}{L}\right)\cdot\frac{L}{R}\cdot\frac{R}{H_0}\cdot\frac{\partial \Phi}{\partial x} = \left(1+\frac{\Delta L}{L}\right)\cdot\frac{L}{R}\cdot\frac{1}{NA_0}\cdot\frac{\partial \Phi}{\partial x} = \frac{L\left(1+\frac{\Delta L}{L}\right)}{R\left(1+\frac{\Delta R}{R}\right)}\cdot\varepsilon \quad \cdots\cdots (5)$$

$$\beta = \left(1+\frac{\Delta L}{L}\right)\cdot\frac{L}{R}\cdot\frac{R}{H_0}\cdot\frac{\partial \Phi}{\partial y} = \left(1+\frac{\Delta L}{L}\right)\cdot\frac{L}{R}\cdot\frac{1}{NA_0}\cdot\frac{\partial \Phi}{\partial y} = \frac{L\left(1+\frac{\Delta L}{L}\right)}{R\left(1+\frac{\Delta R}{R}\right)}\cdot\eta \quad \cdots\cdots (6)$$

FIG. 16

$$X'' = X' + \alpha \quad \cdots \cdots \cdots (7)$$

$$Y'' = Y' + \beta \quad \cdots \cdots \cdots (8)$$

$$\frac{X}{H_0} = \frac{X'}{H'_0} = x \quad \cdots \cdots \cdots (9)$$

$$\frac{Y}{H_0} = \frac{Y'}{H'_0} = y \quad \cdots \cdots \cdots (10)$$

$$x = \frac{X''}{H'_0} - \frac{\alpha}{H'_0} \quad \cdots \cdots \cdots (11)$$

$$y = \frac{Y''}{H'_0} - \frac{\beta}{H'_0} \quad \cdots \cdots \cdots (12)$$

FIG. 17

$$\frac{\Delta R}{R} \ll 1 \quad \cdots\cdots\cdots (13)$$

$$\frac{\Delta L}{L} \ll 1 \quad \cdots\cdots\cdots (14)$$

$$\frac{\alpha}{H'_0} = \frac{1}{H'_0} \cdot \frac{L}{R} \cdot \varepsilon \ll 1 \quad \cdots\cdots\cdots (15)$$

$$\frac{\beta}{H'_0} = \frac{1}{H'_0} \cdot \frac{L}{R} \cdot \eta \ll 1 \quad \cdots\cdots\cdots (16)$$

$$\varepsilon(x,y) = \frac{1}{NA_0} \cdot \frac{\partial \Phi}{\partial x} \quad \cdots\cdots\cdots (3')$$

$$\eta(x,y) = \frac{1}{NA_0} \cdot \frac{\partial \Phi}{\partial y} \quad \cdots\cdots\cdots (4')$$

$$x = \frac{X''}{H'_0} \quad \cdots\cdots\cdots (11')$$

$$y = \frac{Y''}{H'_0} \quad \cdots\cdots\cdots (12')$$

F I G. 30
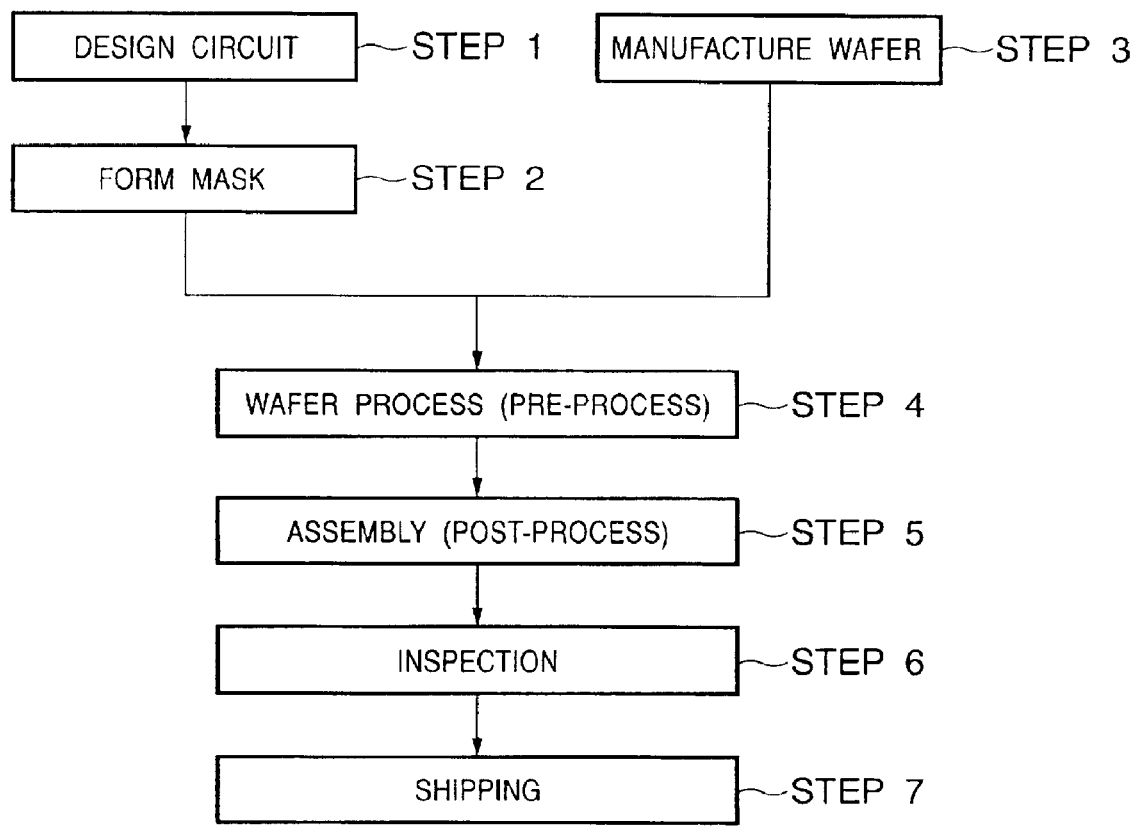

PROJECTION EXPOSURE APPARATUS HAVING ABERRATION MEASUREMENT DEVICE

FIELD OF THE INVENTION

The present invention relates to an exposure apparatus for transferring a pattern on a mask onto a photosensitive substrate via a projection optical system. Such an exposure apparatus is used in lithography in manufacturing, e.g., a semiconductor element.

BACKGROUND OF THE INVENTION

The manufacture of a semiconductor element or the like by photolithography uses a projection exposure apparatus for transferring a circuit pattern or the like formed on a master (to be referred to as a reticle hereinafter) such as a reticle or photomask to a semiconductor wafer or the like coated with a photosensitive agent. An exposure apparatus of this type must accurately transfer a pattern on a reticle to a wafer at a predetermined magnification (reduction ratio). To meet this demand, the exposure apparatus must exploit a projection optical system which exhibits good imaging performance and suppresses aberration. In recent years, a pattern exceeding the general imaging performance of an optical system is often transferred along with further miniaturization of a semiconductor device. The transfer pattern, therefore, is more sensitive to the aberration of the optical system than a conventional pattern. On the other hand, the projection optical system must increase the exposure area and numerical aperture (NA), which makes aberration correction more difficult.

In this situation, demands are arising from measuring imaging performance, e.g., aberration, particularly, wavefront aberration of the projection optical system while the projection optical system is mounted in the exposure apparatus, i.e., is actually used for exposure. This is because measurement of aberration enables more precise lens adjustment corresponding to the state and device design almost free from the influence of aberration.

To meet these demands, the image intensity distribution is measured by a knife edge or slit, as a conventional means of obtaining imaging performance while the projection optical system is mounted in the exposure apparatus. Alternatively, the contrast of a pattern having a specific shape such as a bar chart is obtained.

In the method of obtaining the image intensity distribution by a knife edge or slit, the S/N ratio of image intensity distribution measurement must be about $10^6$ or more in a projection optical system used for semiconductor lithography. This value is difficult to achieve.

To obtain wavefront aberration in the method of obtaining the contrast by using a bar chart, the contrasts of many bar charts must be obtained from a rough pitch to a pitch exceeding the resolution limit. This is not practical in terms of the formation of bar charts and measurement labor.

Further, these methods do not allow measurement of wavefront aberration.

As a method of obtaining wavefront aberration, an interferometer is used. However, the interferometer is generally used as an inspection device in the manufacture of a projection optical system, and is not practically mounted in the exposure apparatus in terms of the technique and cost because an interferometer made up of a prism, mirror, lens, and the like, and an interference illumination system having good coherence must be arranged near a reticle stage or wafer stage in the method using the interferometer. In general, the space near the wafer stage or reticle stage is limited, and the sizes of the interferometer and illumination system must, therefore, be limited. Limitations are also imposed in terms of heat generating and vibration, and the interferometer is difficult to mount. With recent decreases in exposure wavelength, an interferometer light source having good coherence in the exposure wavelength region does not exist or is very expensive. Thus, it is not practical in terms of the technique and cost to mount an interferometer type aberration measurement device in a projection exposure apparatus.

SUMMARY OF THE INVENTION

It is an object of the present invention to provide a projection exposure apparatus having a function of measuring the imaging performance, particularly, wavefront aberration of a projection optical system in a projection exposure apparatus.

According to the present invention, the foregoing object is attained by providing a projection exposure apparatus comprising: a projection optical system for projecting a pattern on a substrate; a holding portion for holding an optical element which propagates light toward the projection optical system; a mask which is arranged near an image plane or object plane of the projection optical system or a plane conjugate to the image plane and object plane and has a transmission portion; an actuator for driving the mask along a plane of an image of the optical element formed by the projection optical system; and a measurement device for measuring an intensity of light which emerges from the optical element, and passes through the projection optical system and the transmission portion of the mask while the mask is driven.

In a preferred embodiment, the apparatus further comprises an arithmetic device for calculating aberration of the projection optical system on the basis of a measurement result of the measurement device.

In a preferred embodiment, the apparatus further comprises an arithmetic device for calculating ray aberration of the projection optical system on the basis of a measurement result of the measurement device.

In a preferred embodiment, the apparatus further comprises an arithmetic device for calculating wavefront aberration of the projection optical system on the basis of a measurement result of the measurement device.

In a preferred embodiment, the optical element is arranged near the object plane of the projection optical system, and the mask is arranged near the image plane of the projection optical system.

In a preferred embodiment, the optical element includes a mask having a transmission portion, and light is emitted toward the projection optical system by illuminating the mask serving as the optical element by an illumination system.

In a preferred embodiment, the optical element is arranged near the image plane of the projection optical system, and the mask is arranged near the object plane of the projection optical system.

In a preferred embodiment, the optical element includes a mask having a transmission portion, and light is emitted toward the projection optical system by illuminating the mask serving as the optical element by an illumination system.

In a preferred embodiment, the projection exposure apparatus further comprises an illumination system, the optical element includes a reflecting member, and the reflecting member reflects, toward the projection optical system, light which is emitted by the illumination system and is incident on the reflecting member via the projection optical system.

In a preferred embodiment, the apparatus further comprises a reflecting mirror for deflecting light which emerges from the optical element and passes through the projection optical system, and guiding the light to the mask.

In a preferred embodiment, the optical element is arranged near the object plane of the projection optical system, the mask is arranged near a plane conjugate to the object plane of the projection optical system, the projection exposure apparatus further comprises a first reflecting mirror arranged on the image plane side of the projection optical system, and a second reflecting mirror for reflecting, toward the measurement device, light which is reflected by the first reflecting mirror and passes through the projection optical system, and light which emerges from the optical element passes through the projection optical system, is reflected by the first reflecting mirror, passes through the projection optical system again, is reflected by the second reflecting mirror, and guided to the mask.

In a preferred embodiment, the optical element and the mask are arranged near the object plane of the projection optical system, the projection exposure apparatus further comprises a reflecting mirror arranged on the image plane side of the projection optical system, and light which emerges from the optical element passes through the projection optical system, is reflected by the reflecting mirror, passes through the projection optical system again, and is guided to the mask.

In a preferred embodiment, the optical element and the mask are arranged near the image plane of the projection optical system, the projection exposure apparatus further comprises a reflecting mirror arranged on the object plane side of the projection optical system, and light which emerges from the optical element passes through the projection optical system, is reflected by the reflecting mirror, passes through the projection optical system again, and is guided to the mask.

In a preferred embodiment, a predetermined region near the image plane or object plane of the projection optical system falls within an isoplanatic region of the projection optical system.

In a preferred embodiment, the light which emerges from a predetermined region near the image plane or object plane of the projection optical system sufficiently covers a pupil of the projection optical system.

According to another aspect of the present invention, the foregoing object is attained by providing a projection exposure apparatus comprising: an illumination system; a projection optical system for projecting a pattern on a substrate; a holding portion for holding a first mask having a first transmission portion between the illumination system and the projection optical system; a second mask which is arranged near an image-side focal position of the projection optical system and has a second transmission portion; an actuator for driving the second mask along an image plane of the projection optical system; and a measurement device for measuring a change in intensity of light which is emitted by the illumination system and passes through the first transmission portion, the projection optical system, and the second transmission portion while the second mask is driven.

In a preferred embodiment, the apparatus further comprises an arithmetic device for calculating aberration of the projection optical system on the basis of a measurement result of the measurement device.

In a preferred embodiment, the apparatus further comprises an arithmetic device for calculating ray aberration of the projection optical system on the basis of a measurement result of the measurement device.

In a preferred embodiment, the apparatus further comprises an arithmetic device for calculating wavefront aberration of the projection optical system on the basis of a measurement result of the measurement device.

In a preferred embodiment, the apparatus further comprises an imaging optical system for imaging an exit pupil of the projection optical system on a measurement surface of the measurement device.

In a preferred embodiment, the actuator drives the measurement device and the imaging optical system together with the second mask.

In a preferred embodiment, the second mask, the imaging optical system, and the measurement device constitute an integral measurement unit, and the actuator drives the measurement unit along the image plane of the projection optical system.

In a preferred embodiment, the first mask has a plurality of first transmission portions.

In a preferred embodiment, the first mask has a transfer pattern to be transferred to the substrate, in addition to the first transmission portion.

In still another aspect of the present invention, the foregoing object is attained by providing a projection exposure apparatus comprising: an illumination system; a projection optical system for projecting a pattern on a substrate; a first holding portion for holding a first mask having a first transmission portion between the illumination system and the projection optical system; a first reflecting mirror arranged on an image plane side of the projection optical system; a second mask which is arranged between the illumination system and the projection optical system and has a second transmission portion; a second reflecting mirror for deflecting, toward the second transmission portion, light which is emitted by the illumination system, passes through the first transmission portion and the projection optical system, is reflected by the first reflecting mirror, and passes through the projection optical system again; an actuator for driving the second mask in a predetermined plane; and a measurement device for measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven.

In a preferred embodiment, the apparatus further comprises an arithmetic device for calculating aberration of the projection optical system on the basis of a measurement result of the measurement device.

In a preferred embodiment, the apparatus further comprises an arithmetic device for calculating ray aberration of the projection optical system on the basis of a measurement result of the measurement device.

In a preferred embodiment, the apparatus further comprises an arithmetic device for calculating wavefront aberration of the projection optical system on the basis of a measurement result of the measurement device.

In a preferred embodiment, the first reflecting mirror includes a spherical mirror.

In a preferred embodiment, the second reflecting mirror includes a half-mirror which transmits light emitted by the illumination system toward the projection optical system, and reflects, toward the second transmission portion of the second mask, light which is reflected by the first reflecting mirror and passes through the projection optical system.

In still another aspect of the present invention, the foregoing object is attained by providing a projection exposure apparatus comprising: an illumination system; a projection optical system for projecting a pattern on a substrate; a holding portion for holding a first mask having a first transmission portion between the illumination system and the projection optical system; a second mask which is arranged near an object plane of the projection optical system and has a second transmission portion; a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion; an actuator for driving the second mask along the object plane of the projection optical system; and a measurement device for measuring an intensity of light which is emitted by the illumination system, passes through the first transmission portion and the projection optical system, is reflected by the reflecting mirror, passes through the projection optical system again, and passes through the second transmission portion while the second mask is driven.

In a preferred embodiment, the apparatus further comprises an arithmetic device for calculating aberration of the projection optical system on the basis of a measurement result of the measurement device.

In a preferred embodiment, the apparatus further comprises an arithmetic device for calculating ray aberration of the projection optical system on the basis of a measurement result of the measurement device.

In a preferred embodiment, the apparatus further comprises an arithmetic device for calculating wavefront aberration of the projection optical system on the basis of a measurement result of the measurement device.

In a preferred embodiment, the reflecting mirror includes a spherical mirror.

In still another aspect of the present invention, the foregoing object is attained by providing a projection exposure apparatus comprising: a substrate stage; a projection optical system for projecting a pattern on a substrate on the substrate stage; a first mask which is arranged between the projection optical system and the substrate stage and has a first transmission portion; and illumination system for illuminating the first transmission portion; a second mask which is arranged between the projection optical system and the substrate stage and has a second transmission portion; a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion; an actuator for driving the second mask along an image plane of the projection optical system; and a measurement device for measuring an intensity of light which is emitted by the illumination system, passes through the first transmission portion and the projection optical system, is reflected by the reflecting mirror, passes through the projection optical system again, and passes through the second transmission portion while the second mask is driven.

In a preferred embodiment, the apparatus further comprises an arithmetic device for calculating aberration of the projection optical system on the basis of a measurement result of the measurement device.

In a preferred embodiment, the apparatus further comprises an arithmetic device for calculating ray aberration of the projection optical system on the basis of a measurement result of the measurement device.

In a preferred embodiment, the apparatus further comprises an arithmetic device for calculating wavefront aberration of the projection optical system on the basis of a measurement result of the measurement device.

In a preferred embodiment, the reflecting mirror includes a spherical mirror.

In still another aspect of the present invention, the foregoing object is attained by a method of measuring aberration of a projection optical system in a projection exposure apparatus for projecting a pattern on a substrate via the projection optical system, the projection exposure apparatus having a projection optical system for projecting a pattern on a substrate, a holding portion for holding an optical element which propagates light toward the projection optical system, and a mask which is arranged near an image plane or object plane of the projection optical system or a plane conjugate to the image plane and object plane and has a transmission portion, the method comprising: the measurement step of measuring an intensity of light which emerges from the optical element, and passes through the projection optical system and the transmission portion of the mask while the mask is driven along a plane of an image of the optical element formed by the projection optical system; and the arithmetic step of calculating aberration of the projection optical system on the basis of a measurement result obtained in the measurement step.

In still another aspect of the present invention, the foregoing object is attained by providing a method of measuring aberration of a projection optical system in a projection exposure apparatus for projecting a pattern on a substrate via the projection optical system, the projection exposure apparatus having an illumination system, a projection optical system for projecting a pattern on a substrate, a holding portion for holding a first mask having a first transmission portion between the illumination system and the projection optical system, and a second mask which is arranged near an image-side focal position of the projection optical system and has a second transmission portion, the method comprising: the measurement step of measuring a change in intensity of light which is emitted by the illumination system and passes through the first transmission portion, the projection optical system, and the second transmission portion while the second mask is driven along an image plane of the projection optical system; and the arithmetic step of calculating aberration of the projection optical system on the basis of a measurement result obtained in the measurement step.

In still another aspect of the present invention, the foregoing object is attained by providing a method of measuring aberration of a projection optical system in a projection exposure apparatus for projecting a pattern on a substrate via the projection optical system, the projection exposure apparatus having an illumination system, a projection optical system for projecting a pattern on a substrate, a first holding portion for holding a first mask having a first transmission portion between the illumination system and the projection optical system; a first reflecting mirror arranged on an image plane side of the projection optical system, a second mask which is arranged between the illumination system and the projection optical system and has a second transmission portion, and a second reflecting mirror for deflecting, toward the second transmission portion, light which is emitted by the illumination system, passes through the first transmission portion and the projection optical system, is reflected by the first reflecting mirror, and passes through the projection optical system again, the method comprising: the measurement step of measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane; and the arithmetic step of calculating aberration of the projection optical system on the basis of a measurement result obtained in the measurement step.

In still another aspect of the present invention, the foregoing object is attained by providing a method of measuring aberration of a projection optical system in a projection exposure apparatus for projecting a pattern on a substrate via the projection optical system, the projection exposure apparatus having an illuminating system, a projection optical system for projecting a pattern on a substrate, a holding portion for holding a first mask having a first transmission portion between the illumination system and the projection optical system, a second mask which is arranged near an object plane of the projection optical system and has a second transmission portion, and a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion, the method comprising: the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along the object plane of the projection optical system; and the arithmetic step of calculating aberration of the projection optical system on the basis of a measurement result obtained in the measurement step.

In still another aspect of the present invention, the foregoing object is attained by providing a method of measuring aberration of a projection optical system in a projection exposure apparatus for projecting a pattern on a substrate via the projection optical system, the projection exposure apparatus having a substrate stage, a projection optical system for projecting a pattern on a substrate on the substrate stage, a first mask which is arranged between the projection optical system and the substrate stage and has a first transmission portion, an illumination system for illuminating the first transmission portion, a second mask which is arranged between the projection optical system and the substrate stage and has a second transmission portion, and a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion, the method comprising: the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system; and an arithmetic step of calculating aberration of the projection optical system on the basis of a measurement result obtained in the measurement step.

In still another aspect of the present invention, the foregoing object is attained by providing a transfer method of transferring a pattern to a substrate by using a projection exposure apparatus, the projection exposure apparatus having a projection optical system for projecting a pattern on a substrate, a holding portion for holding an optical element which propagates light toward the projection optical system, and a mask which is arranged near an image plane or object plane of the projection optical system or a plane conjugate to the image plane and object plane and has a transmission portion, the method comprising: the measurement step of measuring an intensity of light which emerges from the optical element, and passes through the projection optical system and the transmission portion of the mask while the mask is driven along a plane of an image of the optical element formed by the projection optical system; the arithmetic step of calculating aberration of the projection optical system on the basis of a measurement result obtained in the measurement step; the adjustment step of adjusting the projection optical system on the basis of aberration obtained in the arithmetic step; and the transfer step of transferring a pattern to the substrate by using the projection exposure apparatus in which the projection optical system is adjusted.

In still another aspect of the present invention, the foregoing object is attained by providing a transfer method of transferring a pattern to a substrate by using a projection exposure apparatus, the projection exposure apparatus having an illumination system, a projection optical system for projecting a pattern on a substrate, a holding portion for holding a first mask having a first transmission portion between the illumination system and the projection optical system, and a second mask which is arranged near an image-side focal position of the projection optical system and has a second transmission portion, the method comprising: the measurement step of measuring a change in intensity of light which is emitted by the illumination system and passes through the first transmission portion, the projection optical system, and the second transmission portion while the second mask is driven along an image of the projection optical system; the arithmetic step of calculating aberration of the projection optical system on the basis of a measurement result obtained in the measurement step; the adjustment step of adjusting the projection optical system on the basis of aberration obtained in the arithmetic step; and the transfer step of transferring a pattern to the substrate by using the projection exposure apparatus in which the projection optical system is adjusted.

In still another aspect of the present invention, the foregoing object is attained by providing a transfer method of transferring a pattern to a substrate by using a projection exposure apparatus, the projection exposure apparatus having an illumination system, a projection optical system for projecting a pattern on a substrate, a first holding portion for holding a first mask having a first transmission portion between the illumination system and the projection optical system; a first reflecting mirror arranged on an image plane side of the projection optical system, a second mask which is arranged between the illumination system and the projection optical system and has a second transmission portion, and a second reflecting mirror for deflecting, toward the second transmission portion, light which is emitted by the illumination system, passes through the first transmission portion and the projection optical system, is reflected by the first reflecting mirror, and passes through the projection optical system again, the method comprising: the measurement step of measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane; the arithmetic step of calculating aberration of the projection optical system on the basis of a measurement result obtained in the measurement step; the adjustment step of adjusting the projection optical system on the basis of aberration obtained in the arithmetic step; and the transfer step of transferring a pattern to the substrate by using the projection exposure apparatus in which the projection optical system is adjusted.

In still another aspect of the present invention, the foregoing object is attained by providing a transfer method of transferring a pattern to a substrate by using a projection exposure apparatus, the projection exposure apparatus having an illumination system, a projection optical system for projecting a pattern on a substrate, a holding portion for holding a first mask having a first transmission portion between the illumination system and the projection optical system, a second mask which is arranged near an object plane of the projection optical system and has a second transmission portion, and a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion, the method comprising: the measurement step of measuring an intensity of light which is emitted by the illumination system, is reflected by the reflection mirror, passes through the projection optical system again, and passes through the second transmission portion while the second mask is driven along the object plane of the projection optical system; the arithmetic step of calculating aberration of the projection optical system on the basis of a measurement result obtained in the measurement step; the adjustment step of adjusting the projection optical system on the basis of aberration obtained in the arithmetic step; and the transfer step of transferring a pattern to the substrate by using the projection exposure apparatus in which the projection optical system is adjusted.

In still another aspect of the present invention, the foregoing object is attained by providing a transfer method of transferring a pattern to a substrate by using a projection exposure apparatus, the projection exposure apparatus having a substrate stage, a projection optical system for projecting a pattern on a substrate on the substrate stage, a first mask which is arranged between the projection optical system and the substrate stage and has a first transmission portion, an illumination system for illuminating the first transmission portion, a second mask which is arranged between the projection optical system and the substrate stage and has a second transmission portion, and a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion, the method comprising: the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system; the arithmetic step of calculating aberration of the projection optical system on the basis of a measurement result obtained in the measurement step; the adjustment step of adjusting the projection optical system on the basis of aberration obtained in the arithmetic step; and the transfer step of transferring a pattern to the substrate by using the projection exposure apparatus in which the projection optical system is adjusted.

In still another aspect of the present invention, the foregoing object is attained by providing a method of manufacturing a device by using a projection exposure apparatus, the projection exposure apparatus having a projection optical system for projecting a pattern on a substrate, a holding portion for holding an optical element which propagates light toward the projection optical system, and a mask which is arranged near an image plane or object plane of the projection optical system or a plane conjugate to the image plane and object plane and has a transmission portion, the method comprising: the measurement step of measuring an intensity of light which emerges from the optical element, and passes through the projection optical system and the transmission portion of the mask while the mask is driven along a plane of an image of the optical element formed by the projection optical system; the arithmetic step of calculating aberration of the projection optical system on the basis of a measurement result obtained in the measurement step; the adjustment step of adjusting the projection optical system on the basis of the aberration obtained in the arithmetic step; the transfer step of transferring a pattern to a photosensitive member of the substrate coated with the photosensitive member by using the projection exposure apparatus in which the projection optical system is adjusted; and the developing step of developing the photosensitive member bearing the pattern.

In still another aspect of the present invention, the foregoing is attained by providing a method of manufacturing a device by using a projection exposure apparatus, the projection exposure apparatus having an illumination system, a projection optical system for projecting a pattern on a substrate, a holding portion for holding a first mask having a first transmission portion between the illumination system and the projection optical system, and a second mask which is arranged near an image-side focal position of the projection optical system and has a second transmission portion, the method comprising: the measurement step of measuring a change in intensity of light which is emitted by the illumination system and passes through the first transmission portion, the projection optical system, and the second transmission portion while the second mask is driven along an image plane of the projection optical system; the arithmetic step of calculating aberration of the projection optical system on the basis of a measurement result obtained in the measurement step; the adjustment step of adjusting the projection optical system on the basis of the aberration obtained in the arithmetic step; the transfer step of transferring a pattern to a photosensitive member of the substrate coated with the photosensitive member by using the projection exposure apparatus in which the projection optical system is adjusted; and the developing step of developing the photosensitive member bearing the pattern.

In still another aspect of the present invention, the foregoing is attained by providing a method of manufacturing a device by using a projection exposure apparatus, the projection exposure apparatus having an illumination system, a projection optical system for projecting a pattern on a substrate, a first holding portion for holding a first mask having a first transmission portion between the illumination system and the projection optical system; a first reflecting mirror arranged on an image plane side of the projection optical system, a second mask which is arranged between the illumination system and the projection optical system and has a second transmission portion, and a second reflecting mirror for deflecting, toward the second transmission portion, light which is emitted by the illumination system, passes through the first transmission portion and the projection optical system, is reflected by the first reflecting mirror, and passes through the projection optical system again, the method comprising: the measurement step of measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane; the arithmetic step of calculating aberration of the projection optical system on the basis of a measurement result obtained in the measurement step; the adjustment step of adjusting the projection optical system on the basis of the aberration obtained in the arithmetic step; the transfer step of transferring a pattern to a photosensitive member of the substrate coated with the photosensitive member by using the projection exposure apparatus in which the projection optical system is adjusted; and the developing step of developing the photosensitive member bearing the pattern.

In still another aspect of the present invention, the foregoing is attained by providing a method of manufacturing a device by using a projection exposure apparatus, the projection exposure apparatus having an illumination system, a projection optical system for projecting a pattern on a substrate, a holding portion for holding a first mask having a first transmission portion between the illumination system and the projection optical system, a second mask which is arranged near an object plane of the projection optical system and has a second transmission portion, and a reflecting mirror arranged on an image plane side of the projection optical system, light which is emitted by the illumination system, passes through the first transmission portion and the projection optical system, is reflected by the reflecting mirror, and passes through the projection optical system, again being incident on the second transmission portion, the method comprising: the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along the object plane of the projection optical system; the arithmetic step of calculating aberration of the projection optical system on the basis of a measurement result obtained in the measurement step; the adjustment step of adjusting the projection optical system on the basis of the aberration obtained in the arithmetic step; the transfer step of transferring a pattern to a photosensitive member of the substrate coated with the photosensitive member by using the projection exposure apparatus in which the projection optical system is adjusted; and the developing step of developing the photosensitive member bearing the pattern.

In still another aspect of the present invention, the foregoing is attained by providing a method of manufacturing a device by using a projection exposure apparatus, the projection exposure apparatus having a substrate stage, a projection optical system for projecting a pattern on a substrate on the substrate stage, a first mask which is arranged between the projection optical system and the substrate stage and has a first transmission portion, an illumination system for illuminating the first transmission portion, a second mask which is arranged between the projection optical system and the substrate stage and has a second transmission portion, and a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion, the method comprising: the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system; the arithmetic step of calculating aberration of the projection optical system on the basis of a measurement result obtained in the measurement step; the adjustment step of adjusting the projection optical system on the basis of the aberration obtained in the arithmetic step; the transfer step of transferring a pattern to a photosensitive member of the substrate coated with the photosensitive member by using the projection exposure apparatus in which the projection optical system is adjusted; and the developing step of developing the photosensitive member bearing the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the present invention and, together with the description, serve to explain the principles of the invention.

FIG. 15 is a view showing equations (3) to (6);

FIG. 16 is a view showing equations (7) to (12);

FIG. 17 is a view showing equations (13) to (16), (3'), (11'), and (12');

FIGS. 26A and 26B are graphs showing the light intensity distribution along with scan of a mask having a slit, in which FIG. 26A is a graph showing the light intensity of a principal ray, and FIG. 26B is a graph showing the light intensity as a function of the slit position;

FIG. 30 is a flow chart showing a semiconductor device manufacturing process.

DETAILED DESCRIPTION OF THE PREFERRED EMBODIMENTS

The principle of the present invention will be explained. The present invention is based on the principle adopted in, e.g., the Foucault test, wire test, phase modulation test, and Ronchi test (see, e.g., Daniel Malacara, "Optical Shop testing", John Wiley & Sons, Inc., page 231 (1978)).

In general, a beam coming from a point object converges to one imaging point in an ideal projection optical system free from any aberration, but does not converge to one point in the presence of aberration.

Figure 1:
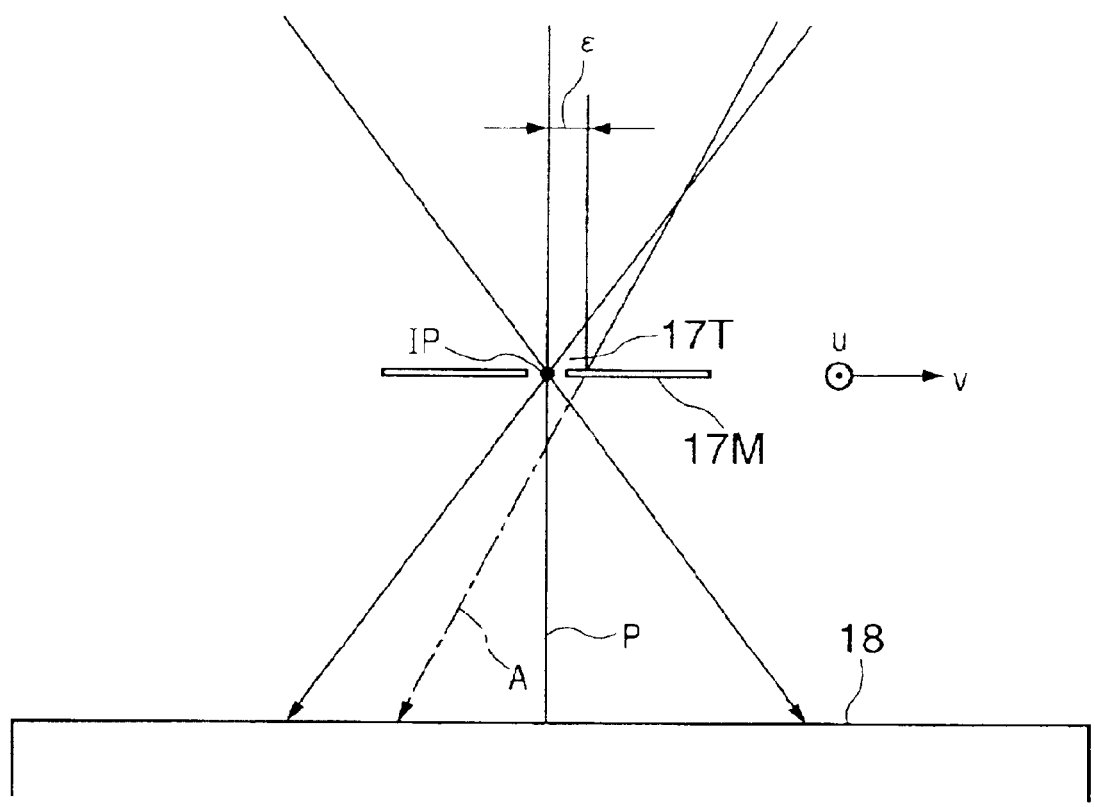
FIG. 1 is a view showing the optical path of a ray A which deviates from an ideal imaging point IP of an optical system with aberration.

FIG. 1 shows the state of a beam near the imaging point. In FIG. 1, a ray A, which is emitted by an illumination system (not shown), passes through a first transmission portion (optical element) regarded as a point object formed on a first mask (not shown), passes through a projection optical system (not shown) and deviates from an ideal imaging performance IP. A second mask 17M having a second transmission portion 17T, and a light intensity distribution measurement device 18 for measuring the light intensity distribution of a beam having passed through the transmission portion 17T are arranged near the imaging point.

Let coordinates (u, v) be the position of the second transmission portion 17T on a plane perpendicular to the optical axis (not shown; vertical direction in FIG. 1) of the projection optical system, and coordinates (x, y) be the position on the light intensity measurement surface of the light intensity distribution measurement device 18. The position on the light intensity measurement surface of the light intensity distribution measurement device 18 is in one-to-one correspondence with the position on the exit pupil of the projection optical system. This can be realized by separating the light intensity distribution measurement device 18 from the image-side focal position of the projection optical system by a certain distance, or arranging an optical system which conjugates the position on the light intensity measurement surface and the position of the exit pupil of the projection optical system.

In FIG. 1, the ray A deviates from the ideal imaging point IP and is shielded by the non-transmission portion of the second mask 17M owing to the aberration of the projection optical system. In this state, the light intensity distribution of a beam having passed through the second transmission portion 17T of the second mask 17M on the measurement surface of the light intensity distribution measurement device 18 exhibits a dark portion corresponding to the ray A.

Figure 2:
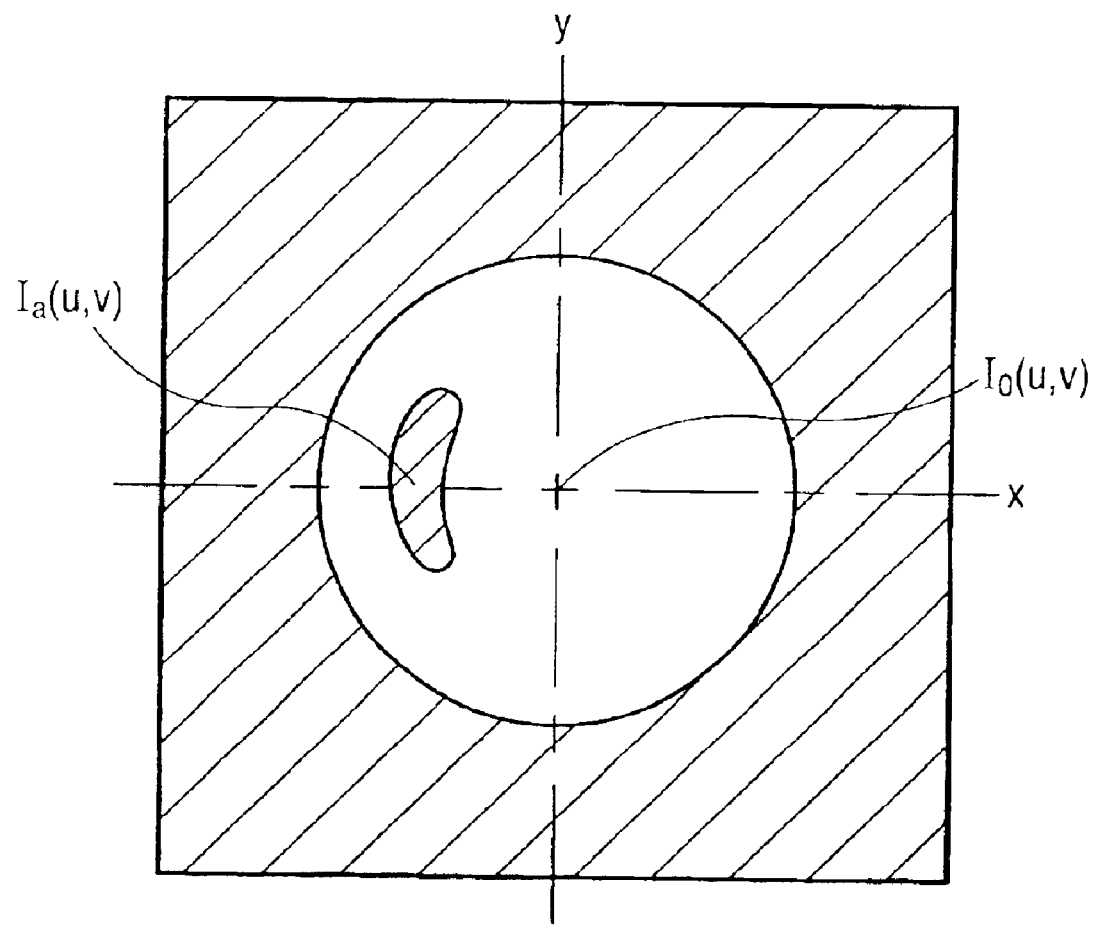
FIG. 2 is a view showing the intensity distribution, of a beam having passed through a second transmission portion, on a light intensity distribution measurement device.

FIG. 2 shows the intensity distribution of a beam having passed through the second transmission portion 17T on the light intensity distribution measurement device 18. $I_0$ (u, v) represents the light intensity of a portion corresponding to a principal ray P when the position of the second transmission portion 17T is (u, v) and $I_a$ (u, v) represents the light intensity of a portion corresponding to the ray A when the position of the second transmission portion 17T is (u, v). $I_a$ (u, v) is low because the ray A is shielded by the non-transmission portion of the second mask 17M.

Letting ($\epsilon$, $\eta$) be the ray aberration of the ray A, the light intensity at a portion corresponding to the ray A becomes equal to $I_0$ (u, v):

$$I_a(u, v) = I_0(u-\epsilon, v-\eta)$$

when the second transmission portion 17T is moved by ($\epsilon$, $\eta$).

For this reason, changes in light intensity at respective points on the light intensity distribution measurement device 18 are plotted while the position (u, v) or the second transmission portion 17T is moved. As a result, a distribution shifted in phase by an amount corresponding to ray aberration (changes in intensity along with movement) can be obtained. This phase shift amount can be obtained to determine ray aberration.

Figure 3:
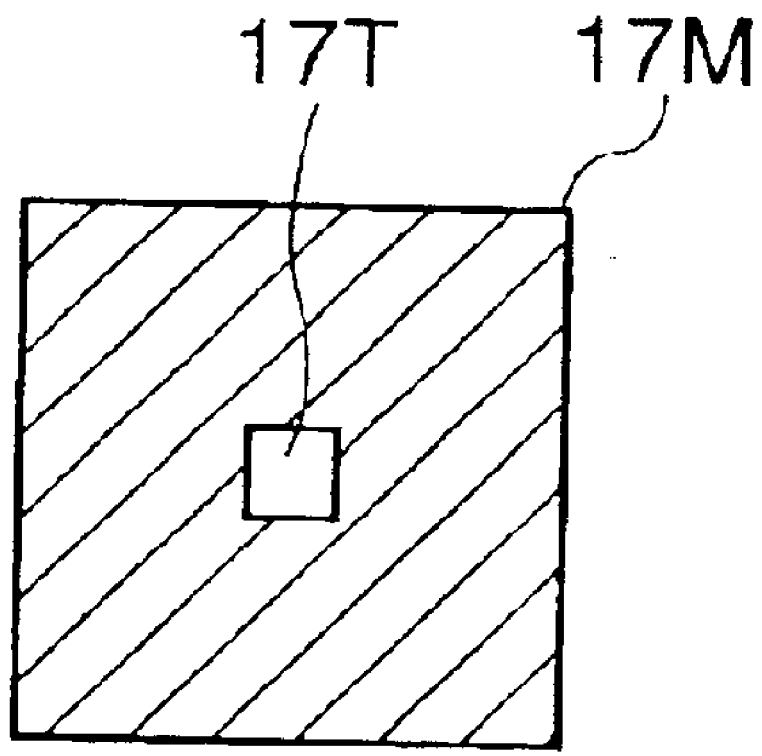
FIG. 3 is a view showing an example of a mask having a second transmission portion.

FIG. 3 is a view showing the second mask 17M having the second transmission portion 17T. A square aperture is formed as the second transmission portion (optical element) 17T in a non-transmission substrate.

Figure 4A:
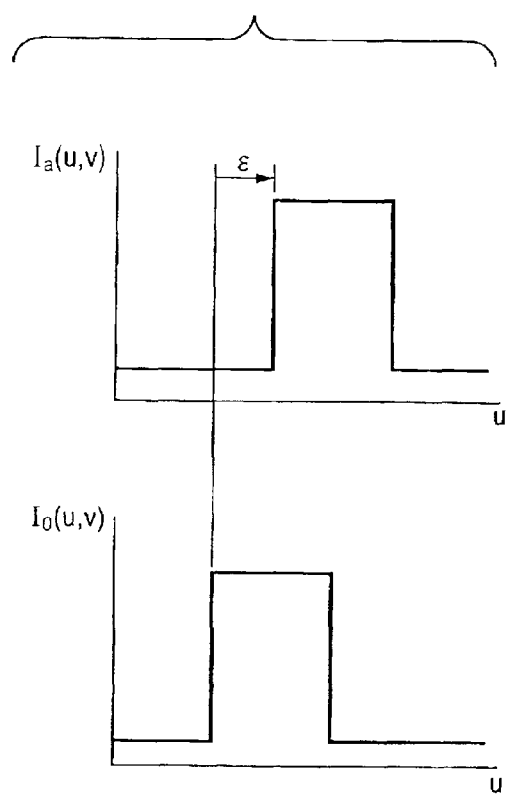
FIGS. 4A and 4B are graphs showing the light intensity distributions of rays A and P shown in FIG. 1 along the u and v axes on the measurement surface of the light intensity distribution measurement device.

FIG. 4A is a graph showing the plots of the light intensities $I_a$ (u, v) and $I_0$ (u, v) on the measurement surface of the light intensity distribution measurement device 18 along the u axis. In FIG. 4A, the two plots have a phase shift of a ray aberration $\epsilon$ along the u axis.

Figure 4B:
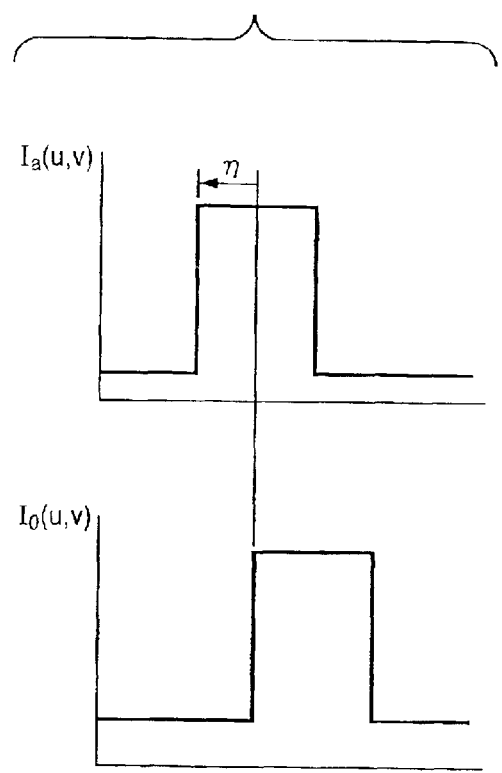

FIG. 4B is a graph showing the plots of the light intensities $I_a$ (u, v) and $I_0$ (u, v) on the measurement surface of the light intensity distribution measurement device 18 along the v axis. In FIG. 4B, the two plots have a phase shift of a ray aberration $\eta$ along the v axis.

Since each point (x, y) on the light intensity measurement surface of the light intensity distribution measurement device 18 is in one-to-one correspondence with the exit pupil of the projection optical system, as described above, the ray aberration ($\epsilon$, $\eta$) is regarded as aberration of a ray having passed through the point (x, y) on the exit pupil.

In the above description, the first transmission portion (optical element) arranged between the illumination system and the projection optical system is regarded as a point object. If the first transmission portion is an object smaller than the isoplanatic region of the projection optical system, the transmission portion need not be so small as to be regarded as a point object. In the isoplanatic region, aberration is regarded to be equal throughout this region. Imaging beams with the same aberration that pass through respective points of the first transmission portion are superimposed into the image of the first transmission portion. The plot obtained by scanning the image of the first transmission portion at the second transmission portion 17T has a distribution obtained by superimposing, by size of the second pattern image, the plots in which the first transmission portion is regarded as the point object.

Figure 5:
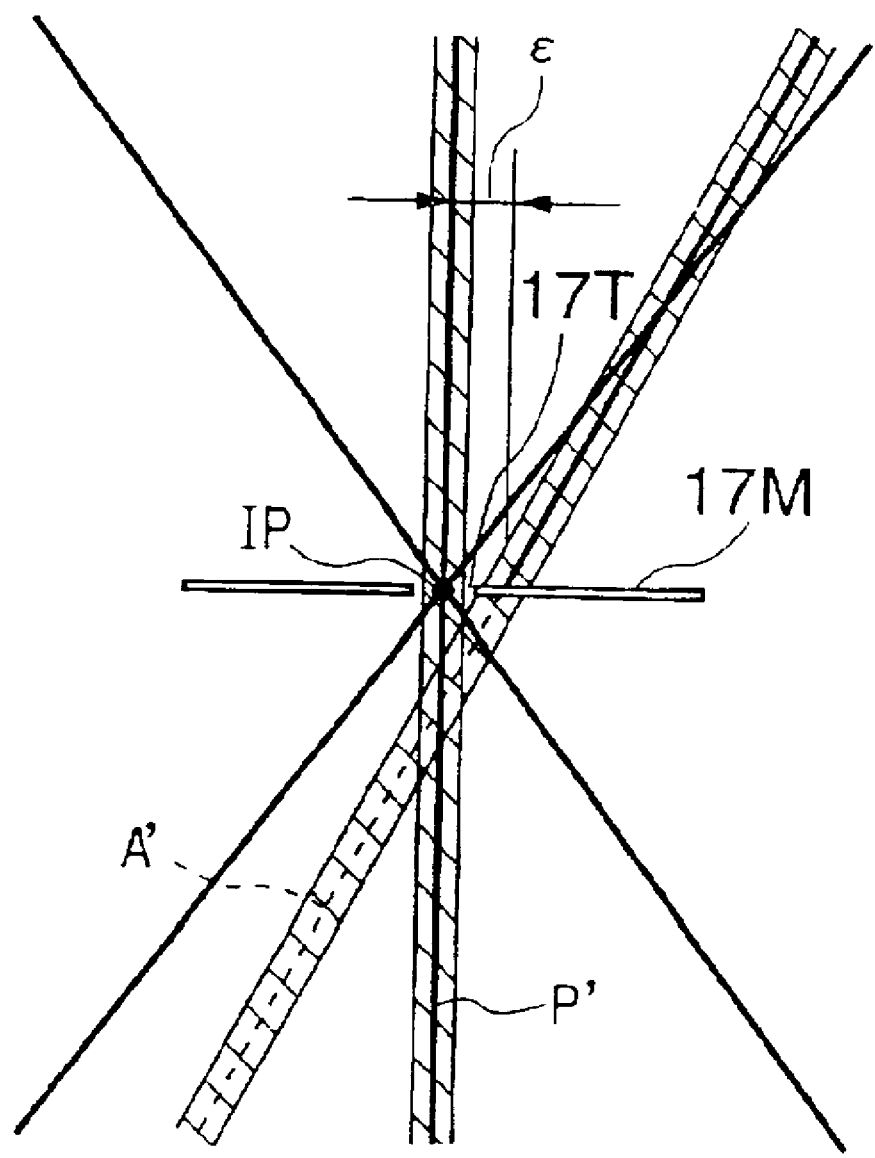
FIG. 5 is a view for explaining a beam near the imaging point IP when the second transmission portion is a square aperture in an isoplanatic region.

FIG. 5 shows a beam near the imaging point of the projection optical system when the first transmission portion arranged between the illumination system and the projection optical system is a square aperture in the isoplanatic region. A' represents a beam corresponding to the ray A; and P', a beam corresponding to the principal ray P. The sections of the two beams are squares equal in size because of the isoplanatic region, and the beam A' deviates from the beam P' by the aberration ($\epsilon$, $\eta$) of the ray A. Let $I'_0(u, v)$ be the light intensity of a portion corresponding to the beam P' when the position of the second transmission portion 17T is (u, v), and $I'_a(u, v)$ be the light intensity of a portion corresponding to the beam A'. Then, as is apparent from FIGS. 6A and 6B, we have $$I'_a(u, v) = I'_0(u-\epsilon, v-\eta).$$

Changes in light intensity at respective points on the light intensity distribution measurement devices 18 are plotted while the position (u, v) of the second transmission portion 17T is moved. Consequently, a distribution shifted in phase by an amount corresponding to ray aberration (changes along with movement) can be obtained. This phase shift amount can be obtained to determine ray aberration. The second transmission portion 17T is the same as that shown in FIG. 3.

Figure 6A:
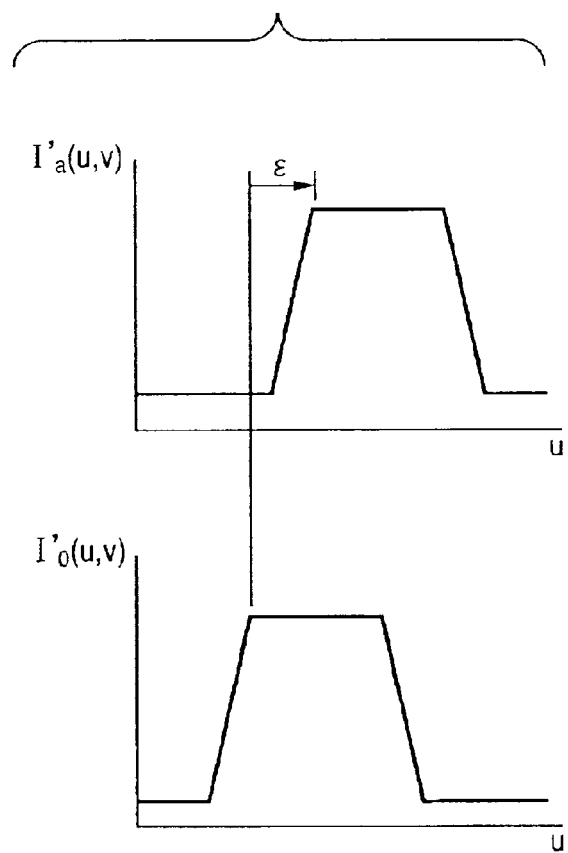
FIGS. 6A and 6B are graphs showing the light intensity distribution of beams A' and P' shown in FIG. 5 along the u and v axes on the measurement surface of the light intensity distribution measurement device.

FIG. 6A is a graph showing the plots of the light intensities $I'_a$ (u, v) and $I'_0$ (u, v) on the measurement surface of the light intensity distribution measurement device 18 along the u axis. In FIG. 6A, the two plots have a phase shift of the ray aberration $\epsilon$ along the u axis.

Figure 6B:
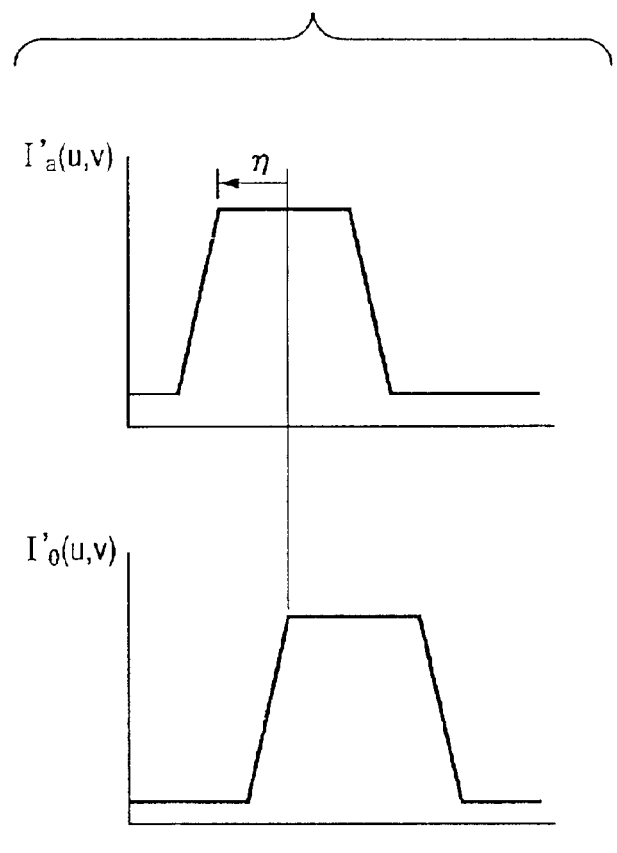

FIG. 6B is a graph showing the plots of the light intensities $I'_a$ (u, v) and $I'_0$ (u, v) on the measurement surface of the light intensity distribution measurement device 18 along the v axis. In FIG. 6B, the two plots have a phase shift of the ray aberration $\eta$ along the v axis.

From this, as far as the first transmission portion falls within the isoplanatic region, the ray aberration ($\epsilon$, $\eta$) can be obtained similarly to a case wherein the first transmission portion is regarded as a point object.

Letting R' be the optical length between the position where the imaging beam crosses the reference sphere and the position where the imaging beam crosses the imaging plane, wavefront aberration $\phi$ and the ray aberration ($\epsilon$, $\eta$) satisfy $$\epsilon(x, y) = R'\frac{\partial \phi}{\partial x} \quad (1)$$

$$\eta(x, y) = R'\frac{\partial \phi}{\partial y} \quad (2)$$

The wavefront aberration $\phi$ can be obtained from this relationship. The relationship is described in, e.g., Max Born, Emill Wolf, "Principles of Optics 6th Edition", Chapter V, 1993, Pergamon Press.

According to the above-described method, a wavefront aberration measurement device can be formed with the same size as that of an imaging performance measurement device using a knife edge, slit, or bar chart, which is available for a projection exposure apparatus, and can be assembled in a projection exposure apparatus.

Preferred embodiments of the present invention will be described below with reference to the accompanying drawings.

[First Embodiment]

Figure 7:
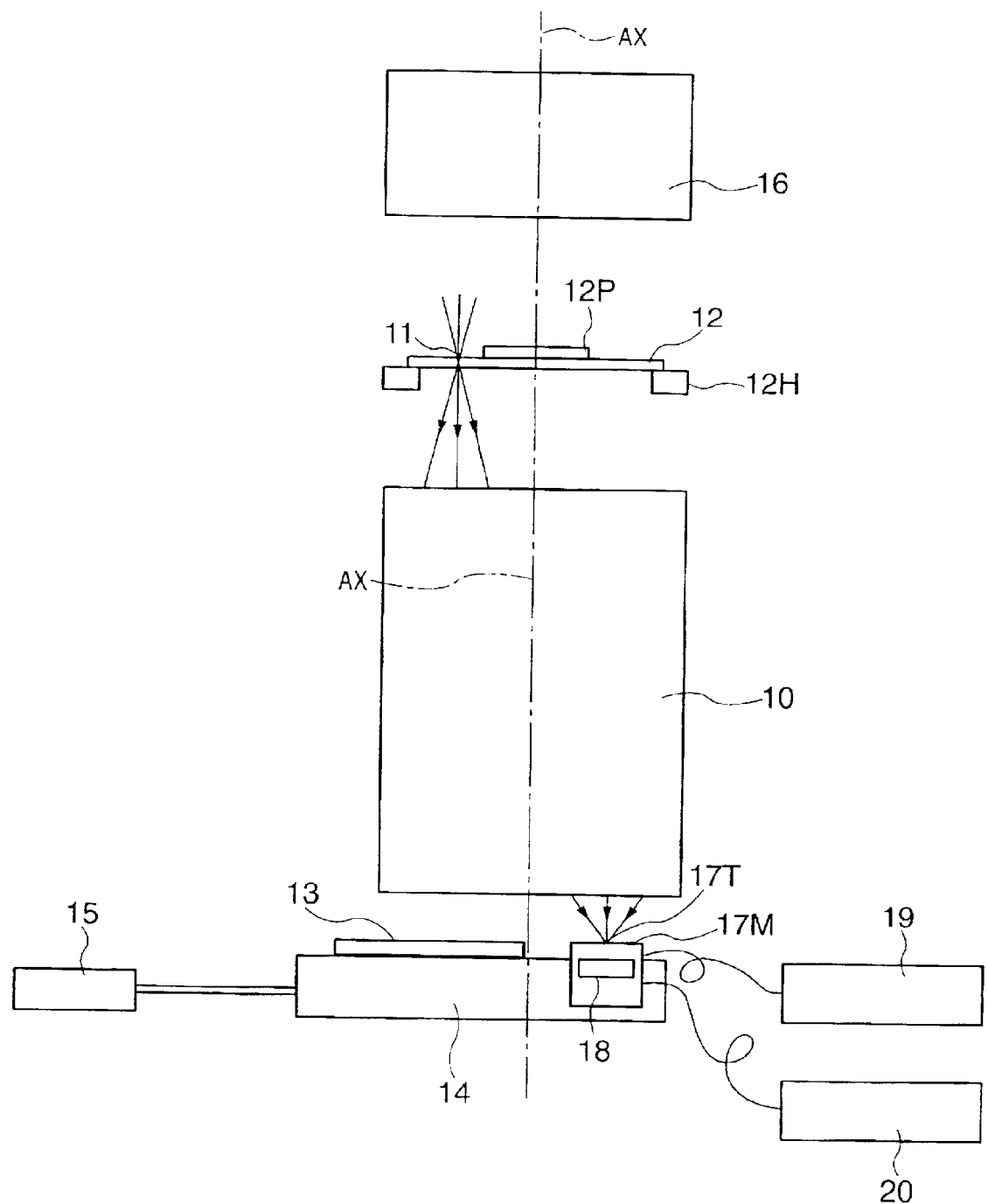
FIG. 7 is a schematic view showing a projection exposure apparatus according to the first embodiment of the present invention.

FIG. 7 shows a projection exposure apparatus according to the first embodiment of the present invention. The projection exposure apparatus shown in FIG. 7 has, as masks for measuring the imaging performance of a projection optical system 10, a mask 12 having a first transmission portion (optical element) 11 and a mask 17M having a second transmission portion 17T. The mask 12 is held by a mask holder 12H. The projection exposure apparatus has a light intensity distribution measurement device 18 as a device for measuring the imaging performance of the projection optical system 10. A wafer is exposed to a device circuit pattern by the exposure apparatus, and then developed and etched. The mask 12 having a mask pattern 12P such as a circuit pattern is held on the object plane of the projection optical system 10 in photolithography for a semiconductor wafer or the like. In the first embodiment, both the mask pattern 12P and first transmission portion (optical element) 11 are formed on the mask 12. Alternatively, the mask pattern 12P and the first transmission portion 11 may be formed on separate masks.

In this embodiment, an illumination system 16 serves as both an illumination system for a circuit pattern (mask pattern) and an illumination system for the first transmission portion 11 serving as a measurement pattern. A beam emitted by the illumination system 16 passes through the mask 12, which is arranged near the object plane (object-side focal position) of the projection optical system 10 and has the first transmission portion 11. The beam forms the image of the first transmission portion 11 at the image-side focal position of the projection optical system 10 via the projection optical system 10. The beam passes through the second transmission portion 17T arranged near the imaging position of the image of the first transmission portion 11, and reaches the measurement surface of the light intensity distribution measurement device 18 where the light intensity distribution is measured. The mask 17M having the second transmission portion 17T and the light intensity distribution measurement device 18 are mounted on a wafer stage 14. The mask 17M is aligned near the imaging position of the image of the first transmission portion 11. A controller 19 controls an actuator (31 in FIG. 9) to scan the mask 17M (second transmission portion 17T) in a plane (image plane) perpendicular to an optical axis AX of the projection optical system 10. A signal processor 20 processes a signal of the light intensity distribution (change along with scan) measured by the light intensity distribution measurement device 18, and obtains aberration such as wavefront aberration of the projection optical system 10. The wafer stage 14 supports a wafer chuck 13 and is driven by a driving device 15.

A beam emitted by the illumination system 16 is assumed to sufficiently cover the entrance pupil of the projection optical system 10 after it passes through the first transmission portion 11. This is realized by an illumination system with σ=1 obtained by exchanging the aperture stop of the illumination system 16.

The first transmission portion 11 is smaller than the isoplanatic region of the projection optical system 10. For the projection system of a semiconductor exposure apparatus several percent of the screen size is regarded as a standard isoplanatic region. For a semiconductor exposure apparatus a 6" mask, the first transmission portion 11 must be below several mm in size.

Figure 8:
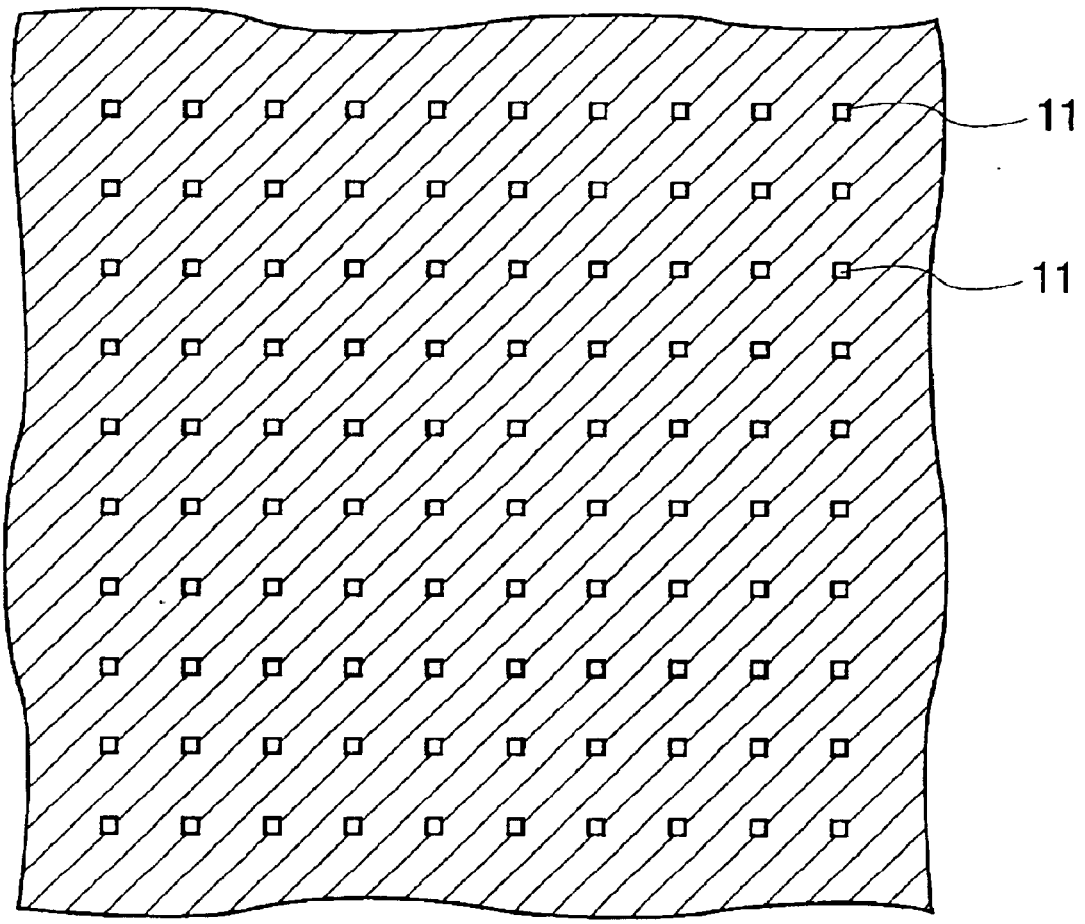
FIG. 8 is a view showing an example in which rectangular apertures are arrayed in a matrix as a first transmission portion.

FIG. 8 shows an example in which rectangular apertures are arrayed as the first transmission portion 11 in a 10×10 matrix in the mask 12. The imaging performance can be measured at a plurality of image points in the projection optical system 10 by arraying a plurality of first transmission portions 11 and measuring the imaging performance at the respective imaging positions.

Figure 9:
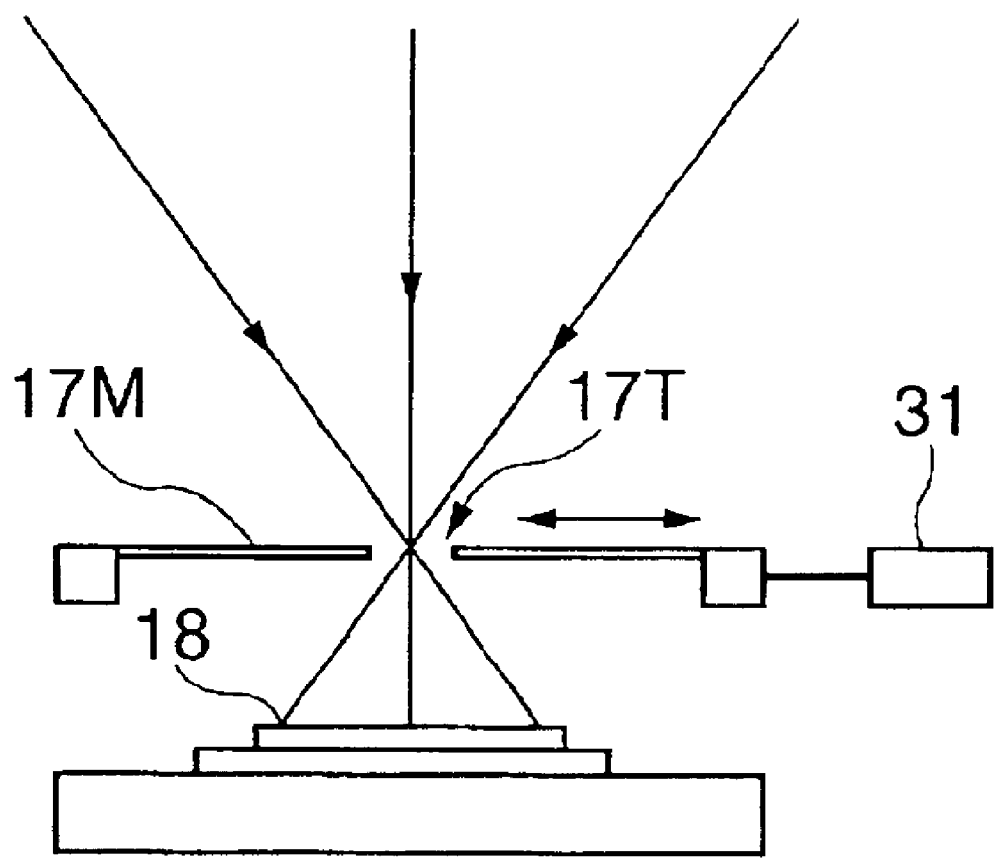
FIG. 9 is a partial, enlarged view showing the second transmission portion T and light intensity distribution measurement device.

FIG. 9 is a partial, enlarged view showing the second transmission portion 17T and light intensity distribution measurement device 18. The second transmission portion 17T and light intensity distribution measurement device 18 are aligned by the wafer stage 14, which holds them, so as to locate the second transmission portion 17T near the imaging position of the image of the first transmission portion 11. A position on the light intensity measurement surface (light-receiving surface) of the light intensity distribution measurement device 18 is in one-to-one correspondence with a position on the exit pupil of the projection optical system. This can be realized by separating the light intensity measurement surface of the light intensity distribution measurement device 18 from the imaging position of the projection optical system toward the optical axis AX by a certain distance. This can also be realized by using a pupil imaging optical system for imaging the exit pupil of the projection optical system 10 onto the light intensity measurement surface of the light intensity distribution measurement device 18. The object-side focal position of the pupil imaging optical system coincides with the position of the second transmission portion 17T, and its image-side focal position coincides with the light intensity measurement surface. The light intensity distribution measurement device 18 has, e.g., a solid-state image sensing element on which many pixels are two-dimensionally arrayed. The image sensing region of the solid-state image sensing element is determined to satisfactorily cover the pupil of the projection optical system 10.

In this state, the second transmission portion 17T is scanned by an actuator 31 in a plane perpendicular to the optical axis AX. The signal processor 20 detects, as a light intensity distribution, changes in light intensity at the respective light-receiving units (pixels) of the solid-stage image sensing element of the light intensity distribution measurement device 18 with respect to the position (u, v) of the second transmission portion 17T. As a result, ray aberration ($\epsilon(x, y)$, $\eta(x, y)$) can be obtained. Note that (x, y) represents positional coordinates on the measurement surface of the light intensity distribution measurement device 18, and is in one-to-one correspondence with coordinates on the exit pupil of the projection optical system 10. The signal processor 20 calculates wavefront aberration $\phi$ (x, y) from the obtained ray aberration on the basis of equations (1) and (2) described above.

In general, R' is an aberration-dependent amount, and calculating wavefront aberration by equations (1) and (2) requires complicated processing.

A practical example of calculating the wavefront aberration $\phi$ by equations (1) and (2) will be described.

Figure 10:
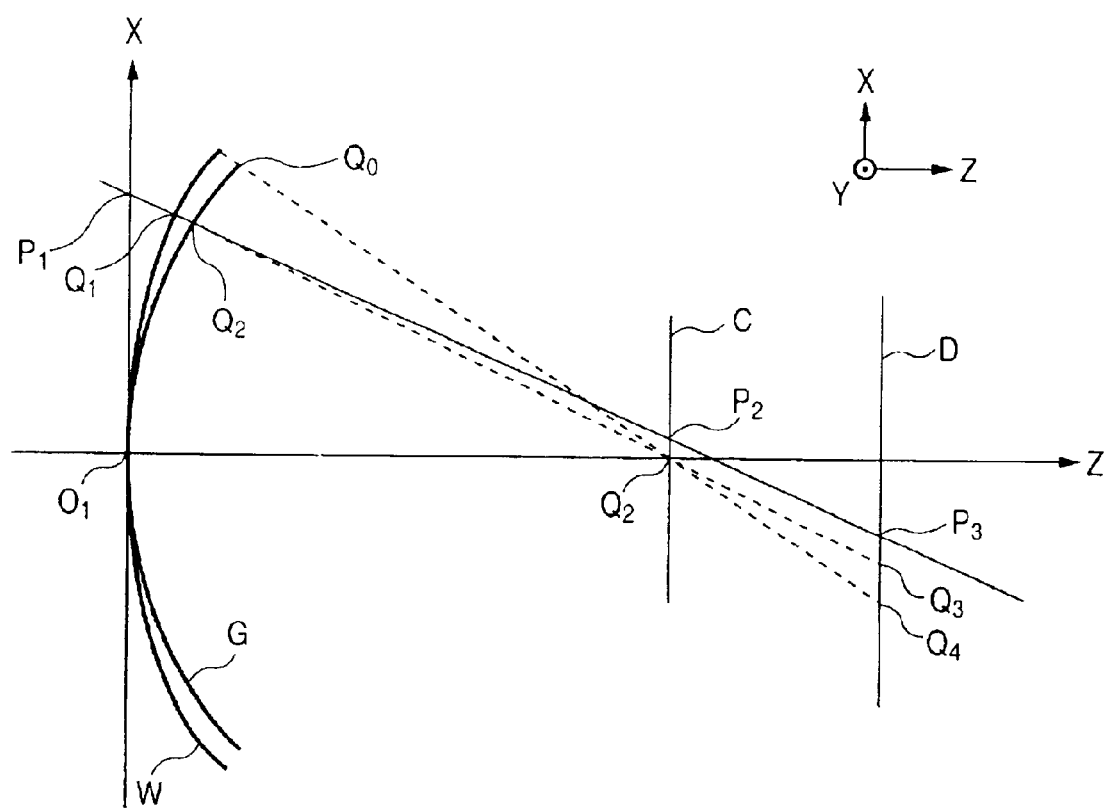
FIG. 10 is a graph for explaining the relationship between the exit pupil and the imaging plane of the projection optical system, a wavefront on the light intensity distribution measurement surface, and a ray.

FIG. 10 is a graph for explaining the relationship between the exit pupil and imaging plane of the projection optical system 10, a wavefront on the light intensity distribution measurement surface, and a ray. In FIG. 10, X, Y, and Z define a coordinate system in which the center of the exit pupil of the projection optical system 10 is an origin and the optical axis AX is the z-axis. W represents the wavefront of an imaging beam from the first transmission portion 11 that is formed by the projection optical system 10 and passes through the center of the exit pupil; G, a reference spherical surface; C, the imaging surface of the projection optical system 10; D, the intensity distribution measurement surface of the light intensity distribution measurement device 18; $O_1$, the center of the exit pupil of the projection optical system 10; and $O_2$, the center of the reference spherical surface.

Further, $P_1$: point at which the imaging beam from the first transmission portion 11 crosses the exit pupil plane $P_2$: point at which the imaging beam from the first transmission portion 11 crosses the imaging plane C $P_3$: point at which the imaging beam from the first transmission portion 11 crosses the intensity distribution measurement surface D of the light intensity distribution measurement device 18

$Q_0$: point at which the maximum NA beam component of the imaging beam from the first transmission portion 11 crosses the reference spherical plane $Q_1$: point at which the imaging beam from the first transmission portion 11 crosses the wavefront W $Q_2$: point at which the imaging beam from the first transmission portion 11 crosses the reference sphere $Q_3$: point at which a straight line $Q_2Q_2$ crosses the intensity distribution measurement surface D, i.e., the point at which the imaging beam from the first transmission portion 11 crosses the intensity distribution measurement surface D when no aberration exits $Q_4$: point at which a straight line $Q_0Q_2$ crosses the intensity distribution measurement surface D, i.e., point at which the outermost imaging beam from the first pattern 11 crosses the intensity distribution measurement surface D when no aberration exists R: radius of the reference sphere R': distance $Q_2P_2$ L: distance $Q_2Q_3$ L': distance $Q_2P_3$ $\phi$: wavefront aberration (optical length $Q_1Q_2$) of the projection optical system 10

($\epsilon$, $\eta$): ray aberration (line segment $O_2P_2$) ($\alpha$, $\beta$): ray aberration (line segment $O_3P_3$) on the intensity distribution measurement surface D $H_0$: maximum radius of the exit pupil of the projection optical system 10

$NA_0$: numerical aperture $NA_0 = H_0/R$ corresponding to the maximum radius of the exit pupil of the projection optical system 10 x- and y-coordinates: X- and Y-coordinates normalized by the maximum radius of the exit pupil of the projection optical system 10

$$X = H_0 \cdot x, \quad Y = H_0 \cdot y$$

$H'_0$: maximum radius of a region where all beam components from the exit pupil of the projection optical system 10 without any aberration cross each other on the intensity distribution measurement surface $$H'_0 = NA_0 \cdot (L-R)$$

From the above-mentioned relationship between wavefront aberration and ray aberration, we have $$\varepsilon = R' \frac{\partial \phi}{\partial X} = R\left(1 + \frac{\Delta R}{R}\right)\frac{\partial \phi}{\partial X}$$

$$\eta = R' \frac{\partial \phi}{\partial Y} = R\left(1 + \frac{\Delta R}{R}\right)\frac{\partial \phi}{\partial Y}$$

where $\Delta R = R' - R$ $$\alpha = L' \frac{\partial \phi}{\partial X} = L\left(1 + \frac{\Delta L}{L}\right)\frac{\partial \phi}{\partial X}$$

$$\beta = L' \frac{\partial \phi}{\partial Y} = L\left(1 + \frac{\Delta L}{L}\right)\frac{\partial \phi}{\partial Y}$$

where $\Delta L = L' - L$.

When these equations are expressed by coordinates normalized by the maximum radius $H_0$, we obtain equations (3), (4), (5), and (6) in FIG. 15.

The relationship between the point $Q_2$ at which the imaging beam from the first transmission portion 11 crosses the reference sphere, and the point $P_3$ at which the imaging beam from the first transmission portion 11 crosses the intensity distribution measurement surface D is obtained. Let $Q_3$ (X', Y') be the point at which the beam crosses the intensity distribution measurement surface D when the beam emerges without any aberration from the point $Q_2$ (X', Y') at which the imaging beam from the first transmission portion 11 crosses the reference sphere, and $P_3$ (X", Y") be the point at which the imaging beam from the first transmission portion 11 crosses the intensity distribution measurement surface D. Then, since the beam deviates from the no-aberration position by the aberration, equations (7) and (8) in FIG. 16 hold.

Letting $Q_3$ (X', Y') be the point at which the beam crosses the intensity distribution measurement surface D when the beam emerges without any aberration from the point $Q_2$ (X', Y'), at which the imaging beam from the first transmission portion 11 crosses the reference sphere plane, equations (9) and (10) in FIG. 16 hold from the relationship with the normalized coordinates in FIG. 10.

From equations (7), (8), (9), and (10), we get $$\frac{X''}{H'_0} = \frac{X'}{H'_0} + \frac{\alpha}{H'_0} = x + \frac{\alpha}{H'_0}$$

$$\frac{Y''}{H'_0} = \frac{Y'}{H'_0} + \frac{\beta}{H'_0} = y + \frac{\beta}{H'_0}$$

Hence, equations (11) and (12) in FIG. 16 can be obtained as the relationship between the point $Q_2$ (x, y) at which the imaging beam from the first transmission portion 11 crosses the reference sphere, and the point $P_3$ (X", Y") at which the imaging beam from the first transmission portion 11 crosses the intensity distribution measurement surface D.

From equations (3), (4), (5), (6), (11), and (12), the relationship between wavefront aberration and ray aberration can be given by equations (3') and (4') in FIG. 17 by the normalized coordinates (x, y) in the region where equations (13), (14), (15), and (16) in FIG. 17 hold.

The relationship between the normalized coordinates (x, y) of the point $Q_2$ at which the imaging beam from the first transmission portion 11 crosses the reference sphere, and the point $P_3$ (X", Y") at which the imaging beam from the first transmission portion 11 crosses the intensity distribution measurement surface D is given by equations (11') and (12') in FIG. 17.

In equations (9), (10), (11'), and (12'), $NA_0$ and $H'_0$ are fixed values irrelevant to aberration, so that wavefront aberration can be calculated by general numerical integration.

For the projection optical system of a semiconductor apparatus, $$\frac{\Delta R}{R} \text{ and } \frac{\Delta L}{L}$$

can be set to $10^{-6}$ or less, and $$\frac{\alpha}{H'_0} = \frac{1}{H'_0} \cdot \frac{L}{R} \cdot \varepsilon \text{ and } \frac{\beta}{H'_0} = \frac{1}{H'_0} \cdot \frac{L}{R} \cdot \eta$$

$\eta$ can be set to $10^{-5}$ or less. Therefore, wavefront aberration can be practically calculated by equations (9), (10), (11'), and (12').

[Second Embodiment]

The second embodiment of the present invention will be explained with reference to FIG. 11. The second embodiment relates to a projection exposure apparatus in which a first transmission portion 11 is arranged on the imaging plane of a circuit pattern (transfer pattern) 12P of a reticle 12, the first transmission portion 11 is illuminated under predetermined illumination conditions, and a second transmission portion 17T is arranged near the imaging position of the image of the first transmission portion that is formed on the reticle 12 via a projection optical system 10. The first transmission portion 11 is set on a wafer stage 14 and illuminated by a second illumination system 21 mounted on the wafer stage 14. The second illumination system 21 as a light source can use light guided from a first illumination system 16 via a guide system 22 such as a fiber light guide. The first transmission portion 11 and second illumination system 21 are moved by the wafer stage 14 so as to locate the first transmission portion 11 at a position on the imaging plane of the transfer pattern 12P, i.e., a position where aberration is measured. A beam from the first transmission portion 11 is formed by the projection optical system 10 into an image on the reticle 12 side of the projection optical system 10. The imaging beam is deflected by a mirror 23. A mask 17M having the second transmission portion 17T is arranged near the imaging position formed by the deflected beam. The mask 17M is scanned by an actuator controlled by a controller 19 along a surface conjugate to the object plane (plane where the mask pattern 12P is set) of the projection optical system 10. The remaining same reference numerals as those in FIG. 7 denote the same parts.

Figure 11:
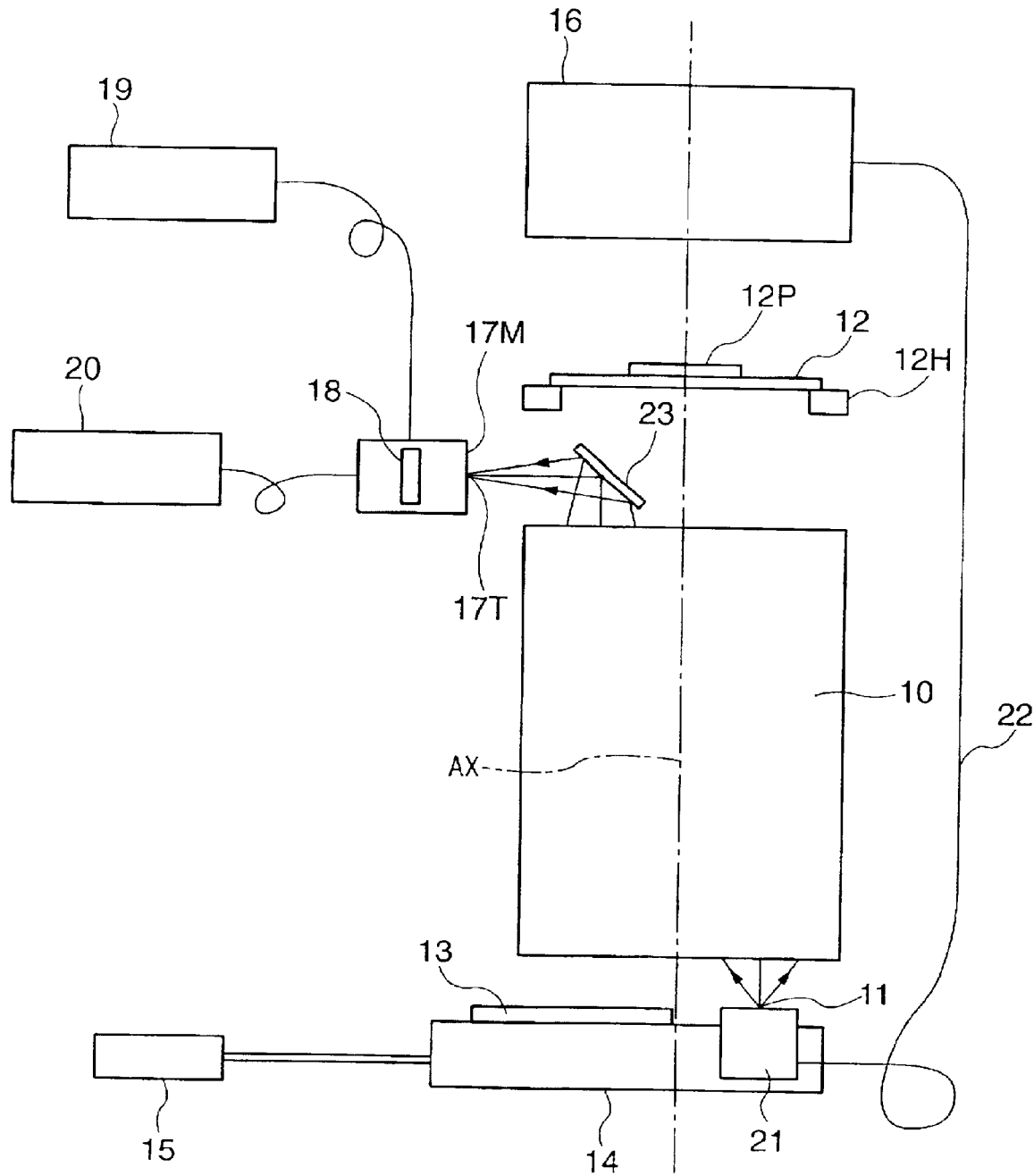
FIG. 11 is a schematic view showing a projection exposure apparatus according to the second embodiment of the present invention.
Figure 12:
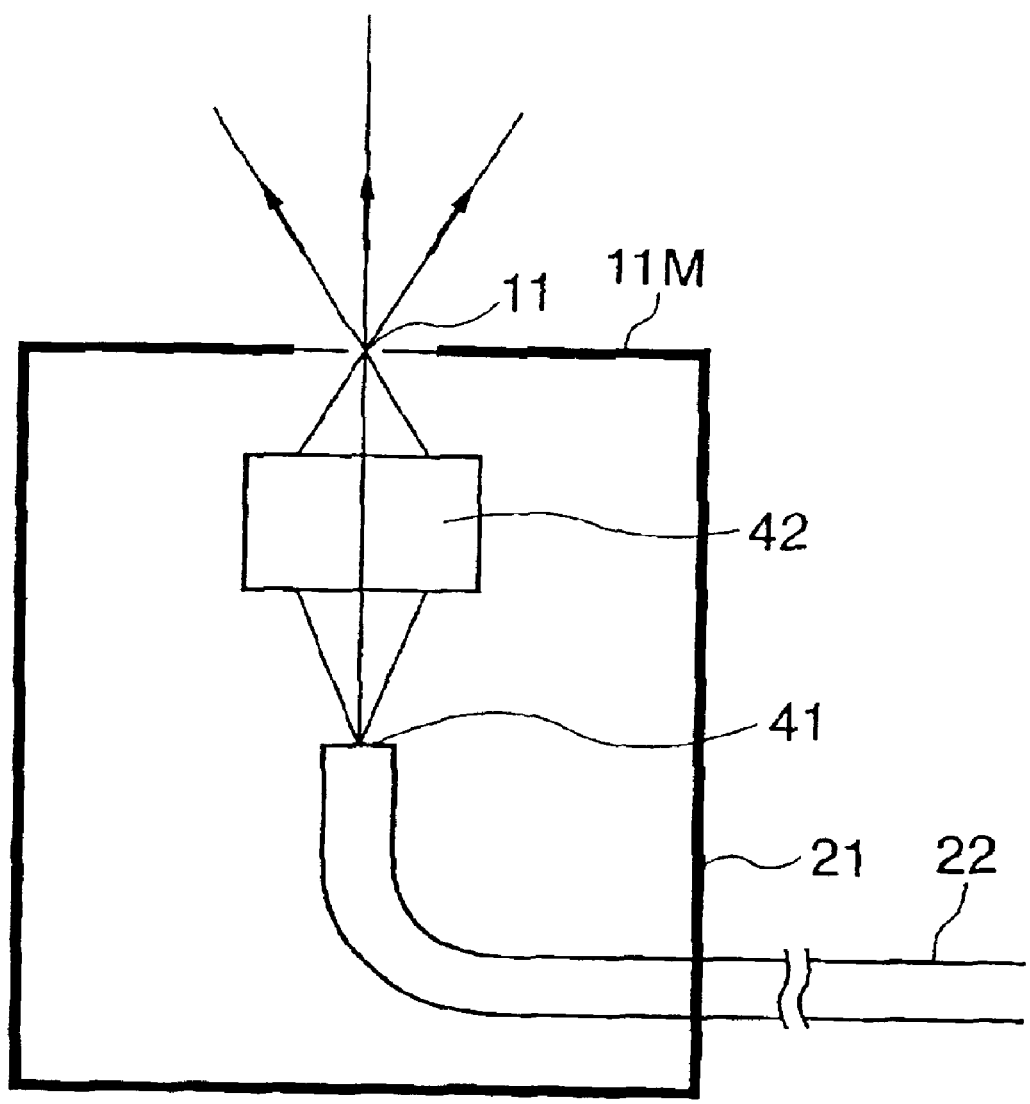
FIG. 12 is a schematic view showing a second illumination system used for the projection exposure apparatus in FIG. 11.

FIG. 12 shows an example of the second illumination system 21 in FIG. 11. A beam guided from the first illumination system 16 via the guide system 22 such as a fiber light guide emerges from a fiber light guide end 41, and illuminates 11M having the first transmission portion 11 so as to diverge to a beam having σ=1 or more to the projection optical system 10 via a condenser lens 42.

[Third Embodiment]

Figure 13:
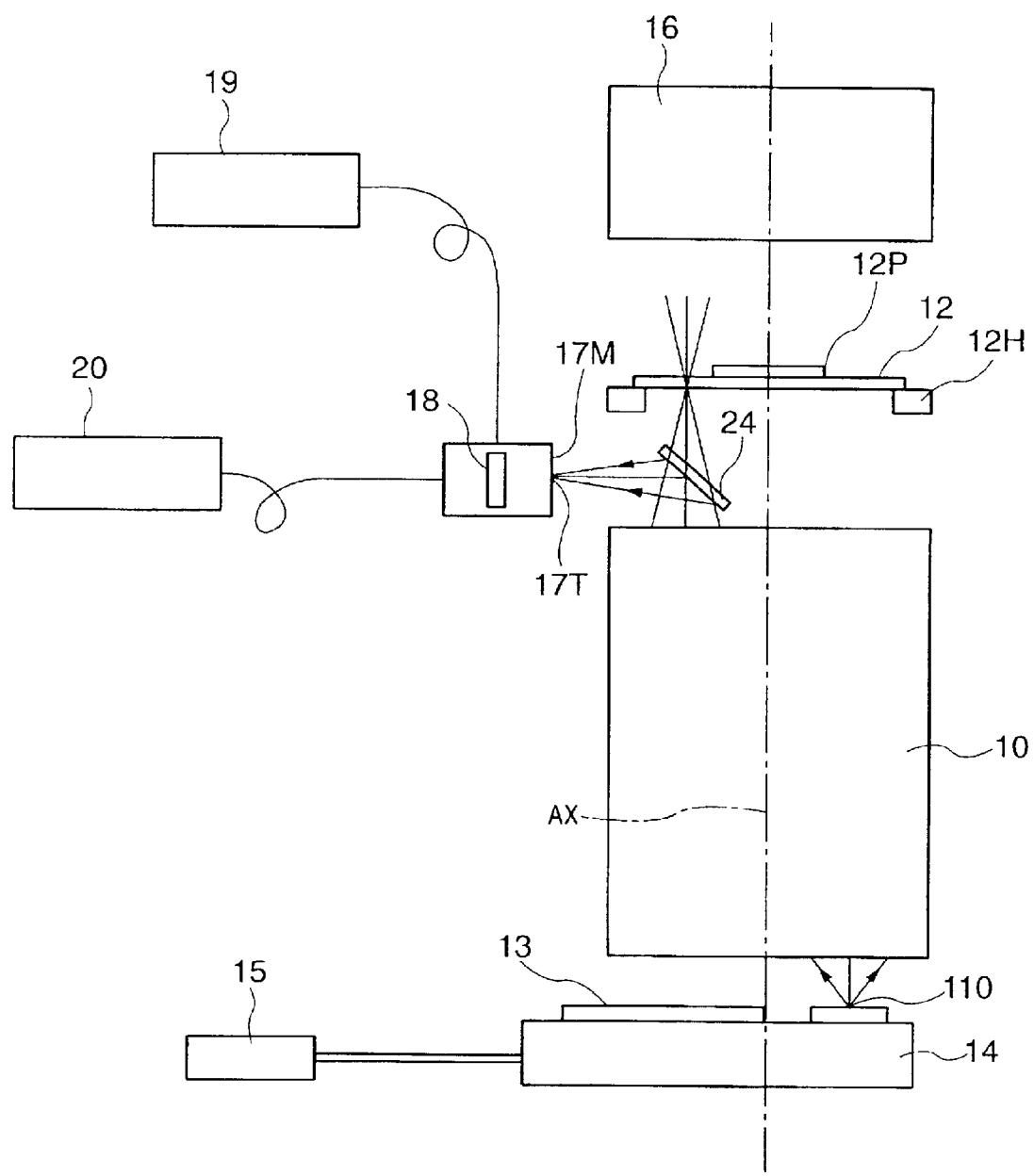
FIG. 13 is a schematic view showing a projection exposure apparatus according to the third embodiment of the present invention.

FIG. 13 shows the third embodiment according to the present invention. In the third embodiment, an illumination system 16 illuminates a reflecting member (optical element) 110 corresponding to the first transmission portion 11 of the first embodiment via a projection optical system 10, and the beam scattered and reflected by the reflecting member 110 is used to measure the wavefront aberration of the projection optical system. The reflecting member 110 is set on a wafer stage 14 and aligned by the wafer stage 14 to a position on the imaging plane of a reticle pattern 12P, i.e., a position where aberration is measured.

In the third embodiment, the illumination system for illuminating the transfer pattern 12P also serves as an illumination system for illuminating the reflecting member 110. The illumination system illuminates the reflecting member 110 via a mask 12 having a transmission portion at a portion conjugate to the reflecting member 110, a semitransparent mirror 24, and the projection optical system 10. In this case, the mask 12 may be eliminated. The beam scattered and reflected by the reflecting member 110 is formed by the projection optical system 10 into an image on the reticle side of the projection optical system 10. The imaging beam is reflected by the semitransparent mirror 24 to deflect the optical path. A transmission portion 17T is arranged near the imaging position formed by the deflected beam. A mask 17M is scanned by an actuator controlled by a controller 19 along a surface conjugate to the object plane (plane where the mask pattern 12P is set) of the projection optical system 10. The remaining same reference numerals as those in FIG. 7 denote the same parts.

[Fourth Embodiment]

Figure 14:
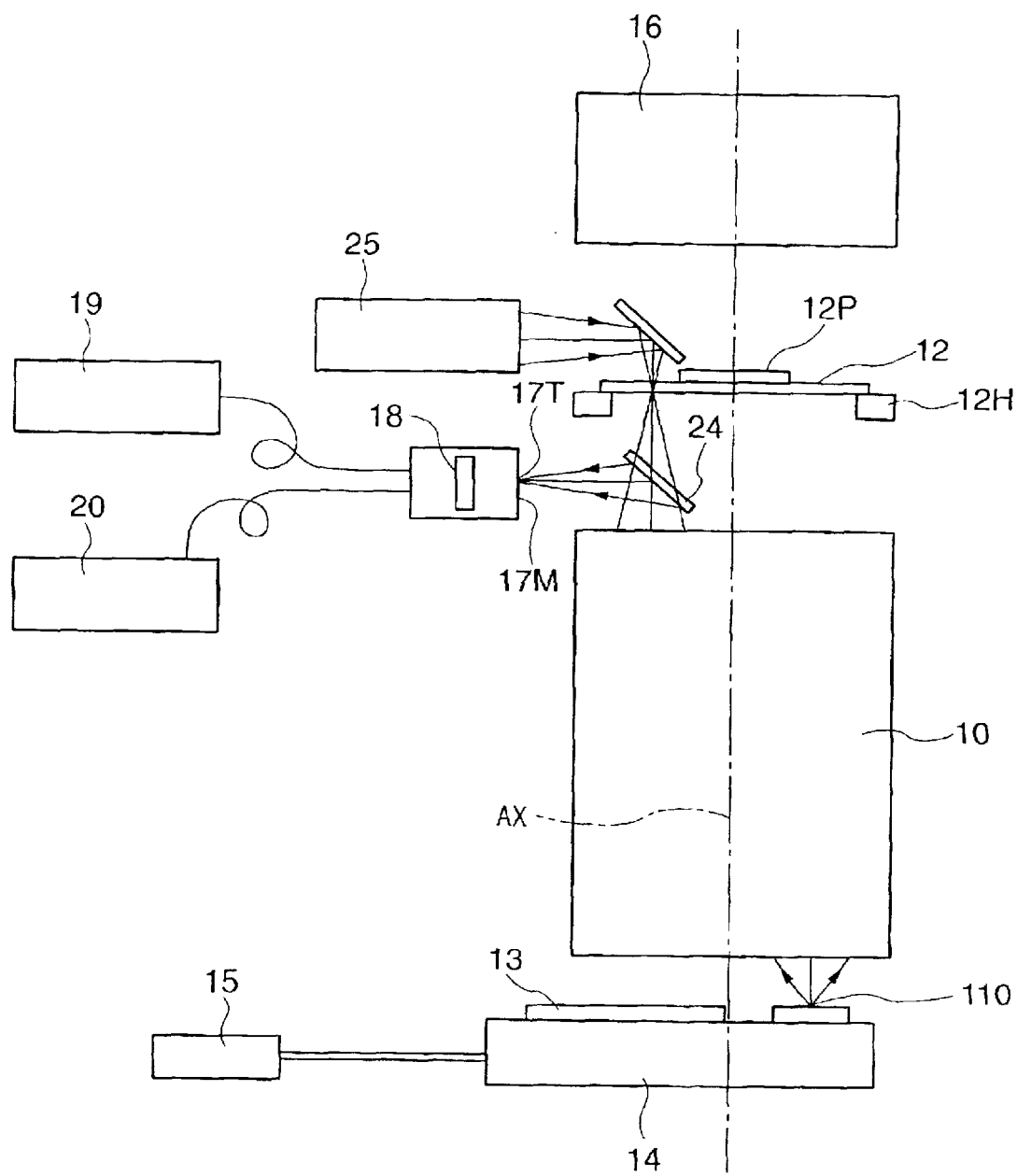
FIG. 14 is a schematic view showing a projection exposure apparatus according to the fourth embodiment of the present invention.

FIG. 14 shows the fourth embodiment according to the present invention. In the fourth embodiment, a second illumination system 25 illuminates a reflecting member (optical element) 110 via a projection optical system 10. That is, the fourth embodiment employs the second light source for illuminating the reflecting member 110, in addition to a first light source 16 for illuminating a transfer pattern 12P. The reflecting member 110 is set on a wafer stage 14 and aligned by the wafer stage 14 to a position where aberration on the imaging plane of the transfer pattern 12P is measured.

The second illumination system 25 illuminates the reflecting member 110 via a mask 12 having a transmission portion at a portion conjugate to the reflecting member 110, a semitransparent mirror 24, and the projection optical system 10. In this case, the mask 12 may be eliminated. The beam scattered and reflected by the reflecting member 110 is formed by the projection optical system 10 into an image on the mask side of the projection optical system 10. The imaging beam is deflected by the semitransparent mirror 24. A mask 17M is arranged near the imaging position formed by the deflected beam. The mask 17M is scanned by an actuator controlled by a controller 19 along a surface conjugate to the object plane (plane where the mask pattern 12P is set) of the projection optical system 10. The remaining same reference numerals as those in FIG. 7 denote the same parts.

In the projection exposure apparatuses of the first to fourth embodiments described above, a plurality of lenses among a plurality of optical elements, which constitute the projection optical system 10, are movable in the optical axis direction and/or a direction perpendicular to the optical axis. One or a plurality of aberrations (particularly, Seidel's five aberrations) in the optical system 10 can be corrected or optimized by moving one or a plurality of lenses by an aberration adjustment driving system (not shown) on the basis of wavefront aberration information obtained by using the above-mentioned methods and apparatuses. A means for adjusting the aberration of the projection optical system 10 includes not only a movable lens but also various known systems such as a movable mirror (when the optical system is a catadioptric system), a tiltable plane-parallel plate, and a pressure-controllable space.

[Fifth Embodiment]

Figure 18:
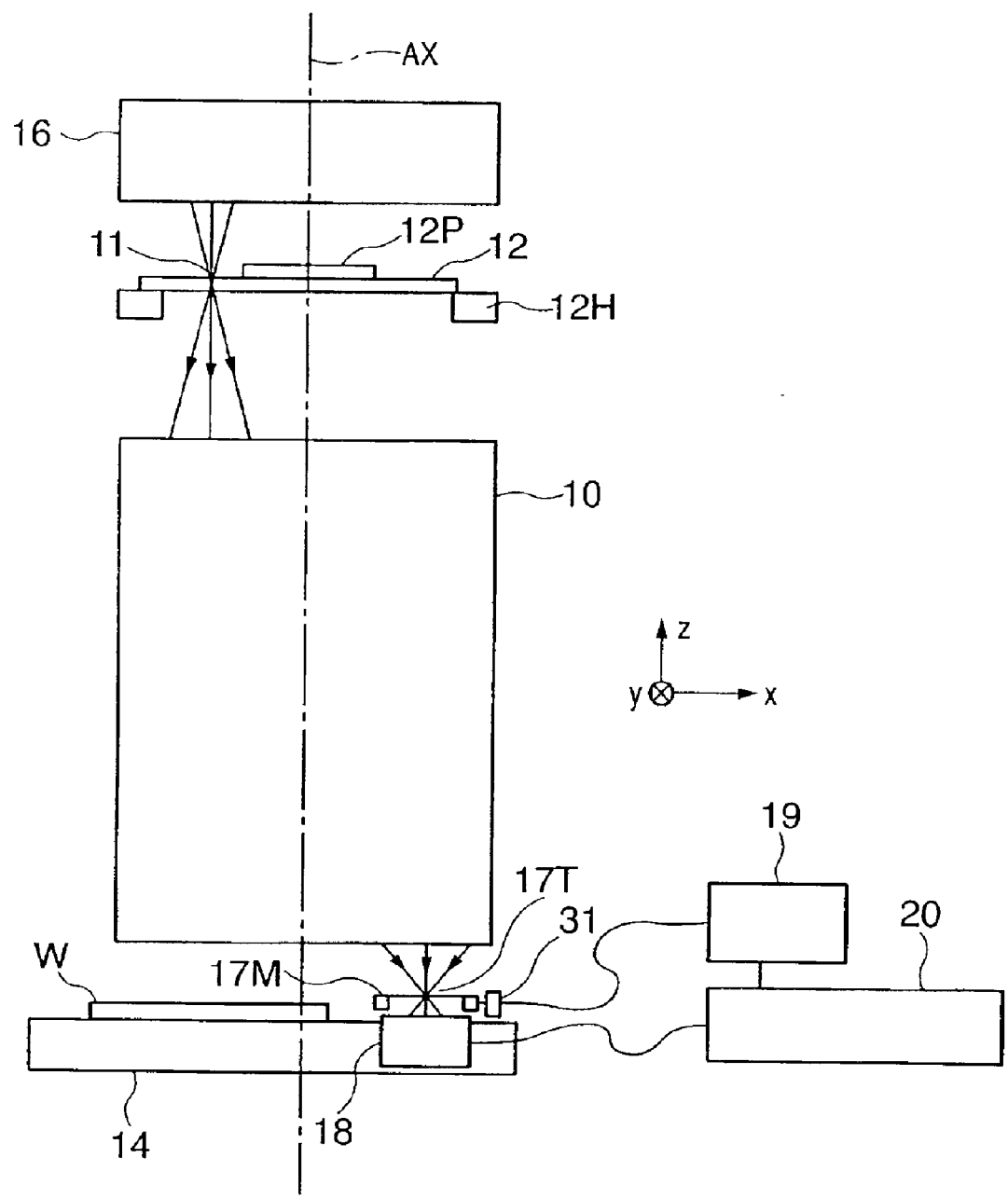
FIG. 18 is a schematic view showing a projection exposure apparatus according to the fifth embodiment of the present invention.

FIG. 18 is a view showing a projection exposure apparatus according to the fifth embodiment of the present invention. A beam emitted by an illumination system 16 passes through a mask 12 having a first transmission portion (optical element) 11, and forms the image of the first transmission portion 11 at the image-side focal position of a projection optical system 10 via this system 16. The beam passes through a second transmission portion 17T arranged near the imaging position of the first transmission portion 11, and reaches the measurement surface of a light intensity distribution measurement device 18 where the light intensity distribution is measured. A second mask 17M having the second transmission portion 17T and the light intensity distribution measurement device 18 are mounted on a wafer stage 14 and aligned near the imaging position of the first transmission portion 11. A controller 19 controls an actuator 31 to scan the mask 17M in a plane perpendicular to an optical axis AX of the projection optical system 10. A signal processor 20 processes a signal of the light intensity distribution (change along with scan) measured by the light intensity distribution measurement device 18, and obtains the wavefront aberration of the projection optical system 10.

Note that the first transmission portion 11 may be formed in a mask having a transfer pattern to be transferred to a wafer W. The first transmission portion 11 and transfer pattern may be illuminated by a common illumination system or separate illumination systems.

A beam emitted by the illumination system 16 is assumed to sufficiently cover the entrance pupil of the projection optical system 10 after it passes through the first transmission portion 11. This is realized by, e.g., setting the numerical aperture of the illumination system 16 to be equal to that of the projection optical system 10 on the reticle 12 side.

The first transmission portion 11 is smaller than the isoplanatic region of the projection optical system 10. For the projection system of a semiconductor exposure apparatus, several % of the screen size is regarded as a standard isoplanatic region. For a semiconductor exposure apparatus using a 6" mask, the first transmission portion 11 is less than several mm in size.

FIG. 8 shows an example in which rectangular apertures are arrayed as the first transmission portion 11 in a 10×10 matrix in the mask 12. The imaging performance of the projection optical system 10 can be measured at a plurality of image points by arraying a plurality of first transmission portions 11 and measuring the imaging performance at the respective imaging positions.

FIG. 9 is a partial, enlarged view showing the second transmission portion 17T and light intensity distribution measurement device 18. The second transmission portion 17T and light intensity distribution measurement device 18 are aligned by the wafer stage 14 so as to locate the second transmission portion 17T near the imaging position of the first transmission portion 11 (image-side focal position of the projection optical system 10).

A position on the light intensity measurement surface of the light intensity distribution measurement device 18 is in one-to-one correspondence with a position on the exit pupil of the projection optical system 10. This can be realized by separating the light intensity distribution measurement device 18 from the imaging position of the projection optical system by some degree. This can also be realized by using a pupil imaging optical system for imaging the exit pupil of the projection optical system 10 onto the light intensity measurement surface of the light intensity distribution measurement device 18. The object-side focal position of the pupil imaging optical system coincides with the position of the second transmission portion 17T, and its image-side focal position coincides with the light intensity measurement surface.

The light intensity distribution measurement device 18 has, e.g., a solid-state image sensing element on which many pixels are two-dimensionally arrayed. The image sensing region of the solid-state image sensing element is determined to satisfactorily cover the pupil of the projection optical system 10.

In this state, the second transmission portion 17T is scanned by the actuator 31 in a plane perpendicular to the optical axis AX. The signal processor 20 receives changes in light intensity detected by the respective pixels of the solid-state image sensing element of the light intensity distribution measurement device 18 with respect to the position (u, v) of the second transmission portion 17T. As a result, ray aberration ($\epsilon(x, y)$ $\eta(x, y)$) is obtained. Note that (x, y) represents positional coordinates on the measurement surface of the light intensity distribution measurement device 18, and is in one-to-one correspondence with coordinates on the exit pupil of the projection optical system 10. The signal processor 20 calculates wavefront aberration $\phi(x, y)$ from the obtained ray aberration on the basis of equations (1) and (2) described above.

[Sixth Embodiment]

Figure 19:
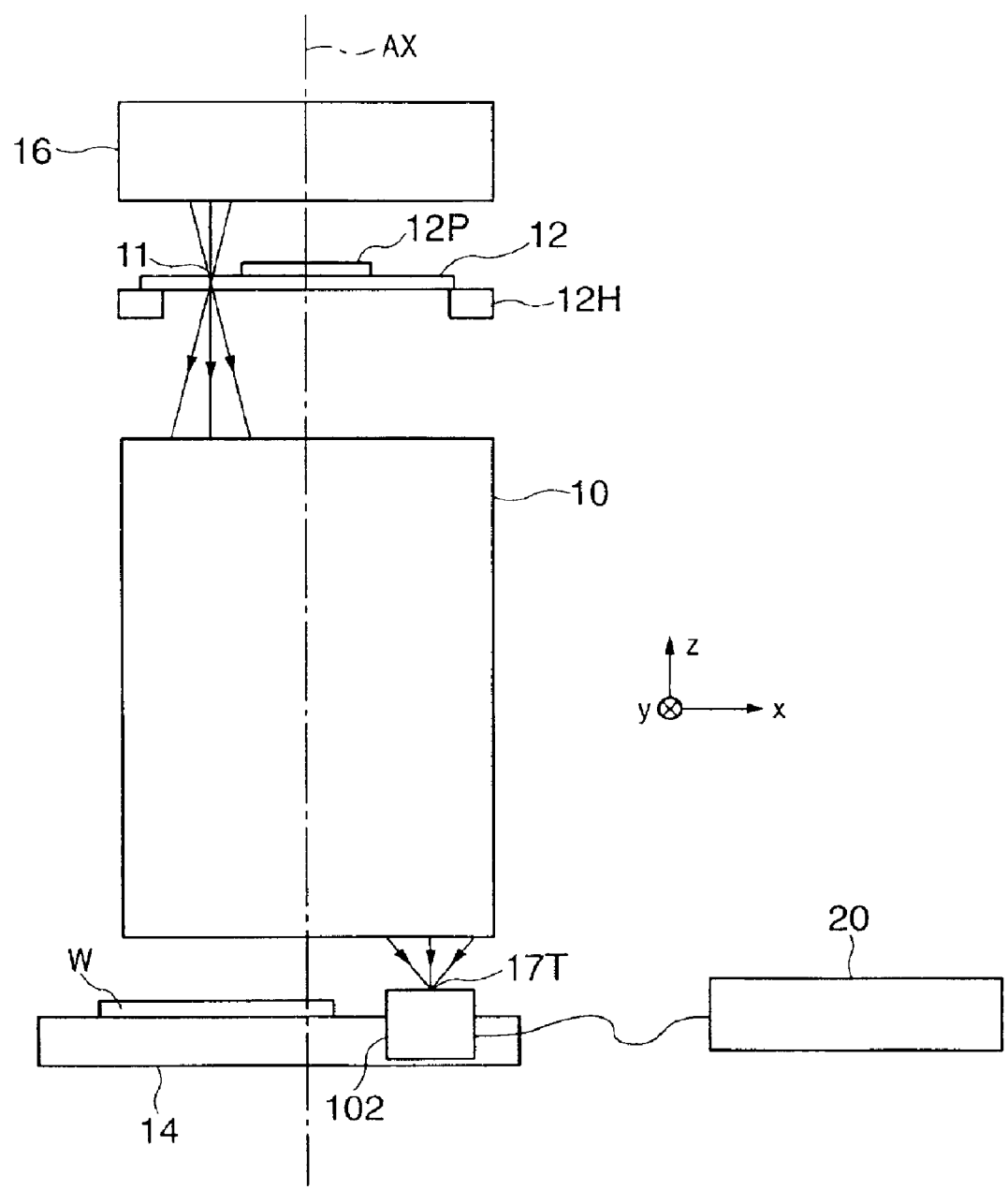
FIG. 19 is a schematic view showing a projection exposure apparatus according to the sixth embodiment of the present invention.

FIG. 19 is a view showing a projection exposure apparatus according to the sixth embodiment of the present invention, which comprises first and second transmission portions and a light intensity distribution measurement device for measuring the imaging performance of a projection optical system.

An illumination system 16 illuminates a transfer pattern 12P and first transmission portion 11. The transfer pattern 12P and first transmission portion 11 are formed on a mask 12, but may be formed on separate masks.

In transferring the transfer pattern 12P to a substrate, a beam emitted by the illumination system 16 passes through the transfer pattern 12P, and forms the image of the transfer pattern 12P at the image-side focal position of the projection optical system 10, i.e., on a wafer W on a wafer stage 14.

In the sixth embodiment, the illumination system 16, the first transmission portion 11, and a measurement unit 102 measure the wavefront aberration of the projection optical system 10. The measurement unit 102 has an integral structure of a second transmission portion 17T and light intensity distribution measurement device 104.

Figure 20:
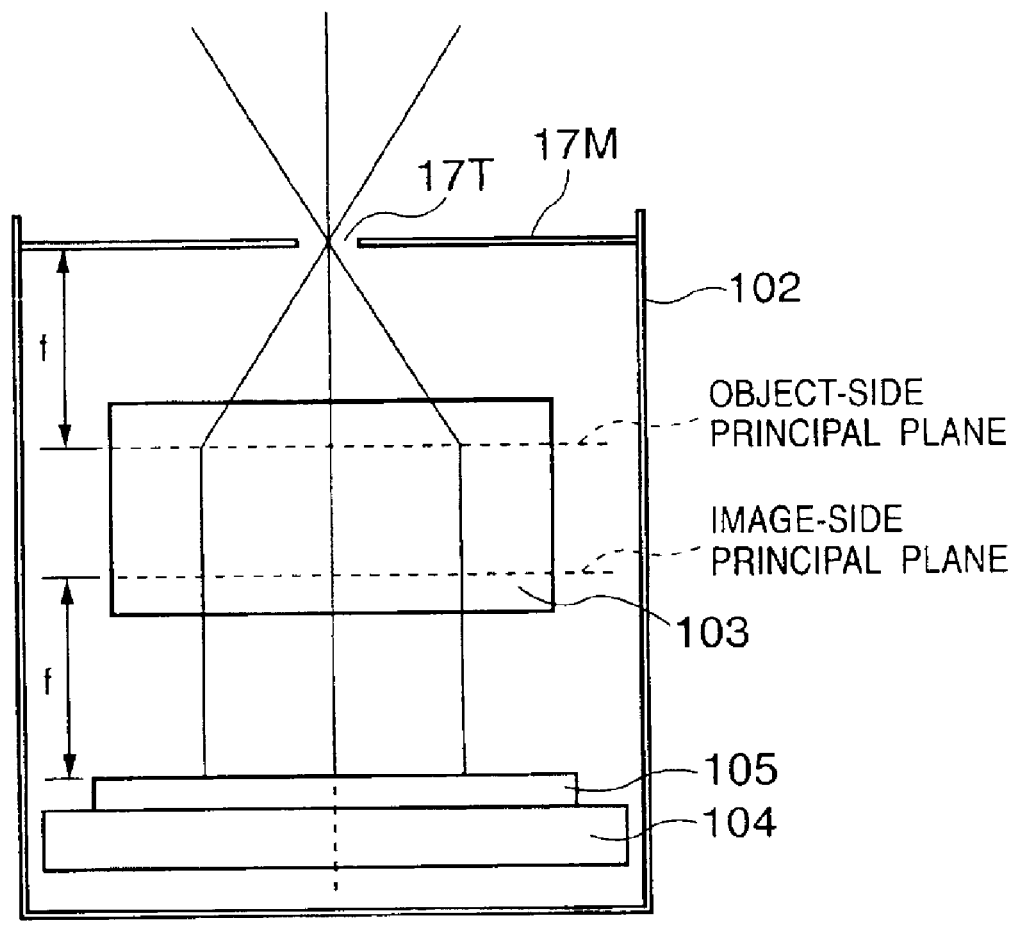
FIG. 20 is a sectional view showing a measurement unit used in the projection exposure apparatus according to the sixth embodiment of the present invention.

FIG. 20 is a view showing the measurement unit 102 in detail. The measurement unit 102 comprises a pupil imaging optical system 103, and the light intensity distribution measurement device 104 with a two-dimensional solid-state image sensing element 105 such as a CCD.

A beam emitted by the illumination system 16 passes through a plurality of transmission portions of the mask 12 having a plurality of first transmission portions 11 as shown in FIG. 8, passes through the projection optical system 10, and forms the image of each first transmission portion 11 at the image-side focal position of the projection optical system 10. The beam passes through the second transmission portion 17T arranged near the imaging position of the first transmission portion 11, and reaches via the pupil imaging optical system 103 the solid-state image sensing element 105 where the light intensity distribution is measured.

By driving the wafer stage as an actuator, the measurement unit 102 can scan a plane perpendicular to an optical axis AX of the projection optical system 10 and can measure changes in light intensity on the solid-state image sensing element 105 to measure the wavefront aberration of the projection optical system 10, similar to the above embodiments.

The pupil imaging optical system 103 is a collimator lens having a focal length f, and is installed in the measurement unit 102 such that the object-side focal plane is located at the position of the second transmission portion 17T and the image-side focal plane is located at the position of the light-receiving surface of the two-dimensional solid-state image sensing element 105. The two-dimensional solid-state image sensing element 105 is conjugate to the exit pupil of the projection optical system 10 via the pupil imaging optical system 103.

Figure 21:
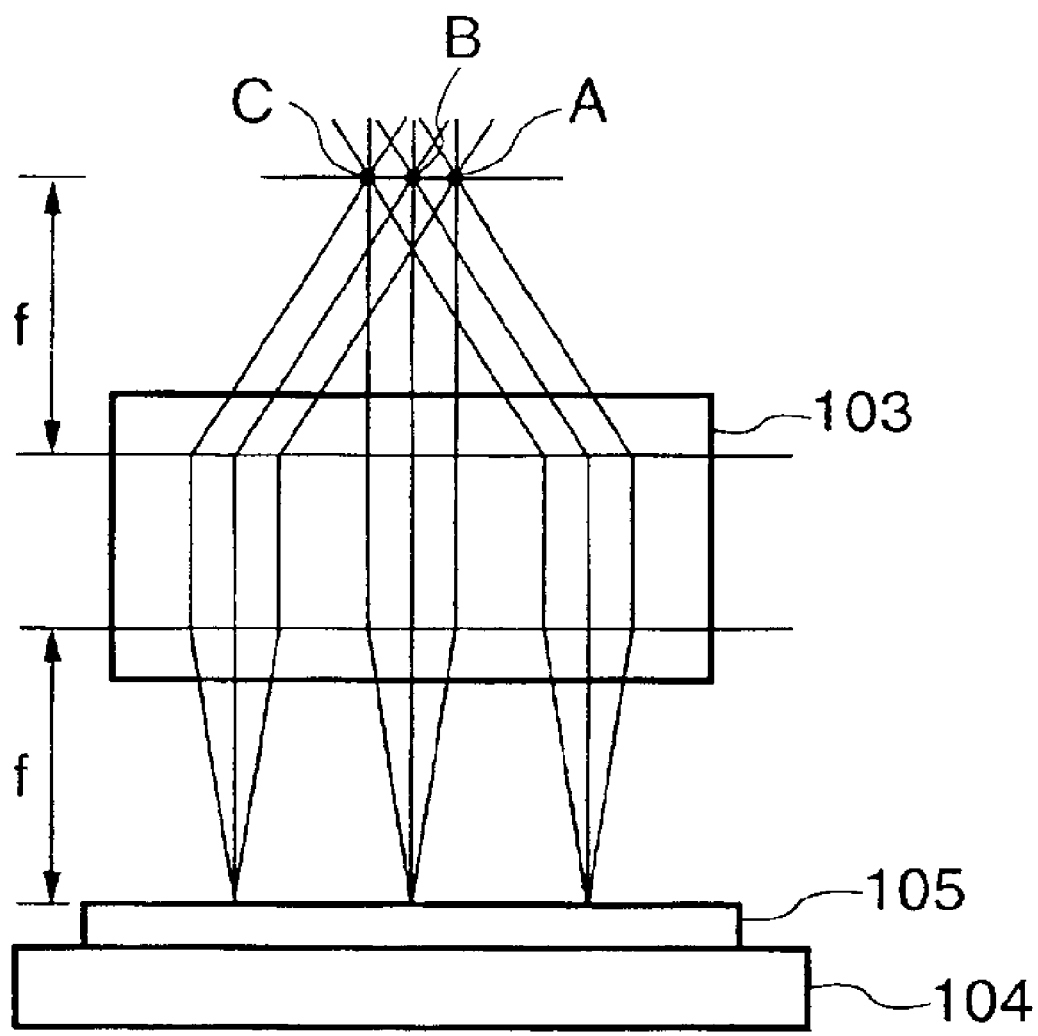
FIG. 21 is a view for explaining an imaging state when the measurement unit moves.

FIG. 21 shows an imaging state observed by a coordinate system using the measurement unit 102 as a reference when the measurement unit 102 moves from negative to positive directions along the x direction in FIG. 10. The second transmission portion 17T is not illustrated.

When the measurement unit 102 moves in the x direction, an imaging point at position A moves from A to B and C. The image of the first transmission portion 11 is formed at the position of the second transmission portion 17T by the projection optical system 10. The object-side focal plane of the pupil imaging optical system 103 coincides with the position of the second transmission portion 17T, and the image-side focal plane of the pupil imaging optical system 103 coincides with the position of the light-receiving surface of the two-dimensional solid-state image sensing element 105. The position of the image of the exit pupil of the projection optical system 10 that is formed on the two-dimensional solid-state image sensing element 105 does not move even when the measurement unit 102 moves. One point of the exit pupil is always imaged at one point on the two-dimensional solid-state image sensing element 105.

By moving the measurement unit 102 in a direction perpendicular to the optical axis AX of the projection optical system 10 in this state, the wavefront aberration of the projection optical system 10 can be measured similarly to the above embodiments.

The sixth embodiment of the present invention can simplify elements arranged on the wafer stage 14 by using the measurement unit 102, which is advantageous in mounting the apparatus.

[Seventh Embodiment]

The seventh embodiment according to the present invention will be described with reference to FIG. 22.

Figure 22:
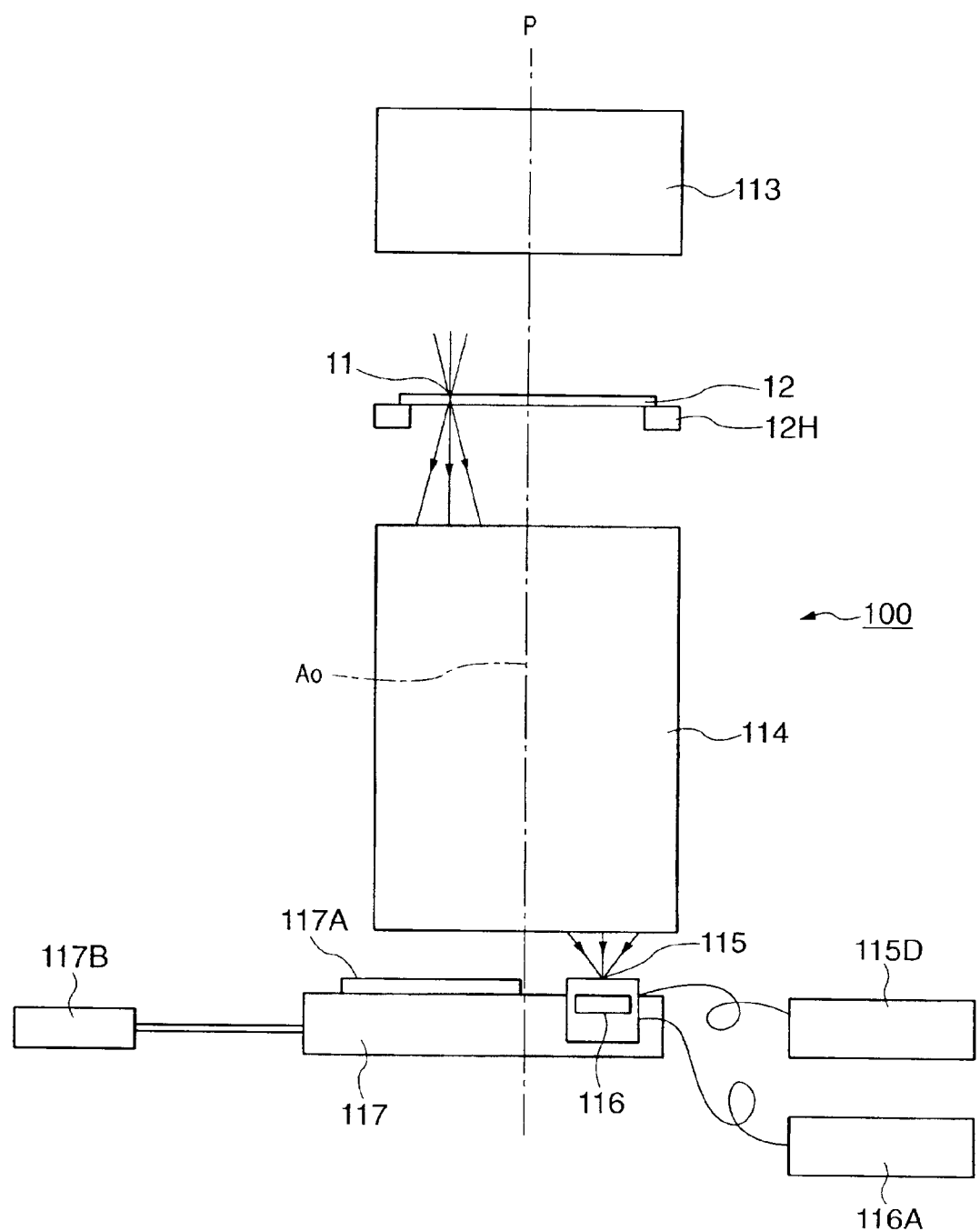
FIG. 22 is a schematic view showing a projection exposure apparatus according to the seventh embodiment of the present invention.

FIG. 22 shows a projection exposure apparatus 100 according to the seventh embodiment. The projection exposure apparatus 100 comprises a mask 12 having a first transmission portion (optical element) 11 for measuring the imaging performance, an auxiliary illumination system 113, a projection optical system 114, a mask 115A having a second transmission portion 115, a light intensity distribution measurement device 116, and a wafer stage 117.

The first transmission portion 11 is formed in the mask 12 and is smaller than the isoplanatic region of the projection optical system 114. For the projection system of a semiconductor exposure apparatus, several percent of the screen size is regarded as a standard isoplanatic region. For a semiconductor exposure apparatus using a 6" mask, the first transmission portion 11 must be less than several mm in size. FIG. 8 shows an example in which rectangular apertures are arrayed as the first transmission portion 11 in a 10×10 matrix in the mask 12. The imaging performance can be measured at a plurality of image points by arraying a plurality of first transmission portions 11 and measuring the imaging performance at the respective imaging positions.

The auxiliary illumination system 113 also serves as a main illumination system in the seventh embodiment. A beam emitted by the auxiliary illumination system 113 is assumed to sufficiently cover the entrance pupil of the projection optical system 114 after it passes through the first transmission portion 11. This is realized by changing the auxiliary illumination system 113 to an illumination system with σ=1.

The projection optical system 114 forms an image from a beam which is emitted by the auxiliary illumination system 113 and passes through the first transmission portion 11 and mask 12. The imaging beam passes through the second transmission portion 115 arranged near the imaging position of the first transmission portion 11 and reaches the measurement surface of the light intensity distribution measurement device 116 where the light intensity distribution is measured.

The mask 115A having the second transmission portion 115 and the light intensity distribution measurement device 116 are mounted on the wafer stage 117 and aligned near the imaging position of the first transmission portion 11. The second transmission portion 115 is moved by an actuator 115C controlled by a controller 115D in a plane perpendicular to an optical axis P. The light intensity distribution measurement device 116 is connected to a light intensity distribution signal processor 116A.

The wafer stage 117 has a wafer chuck 117A and is driven by a driving device 117B.

Figure 23:
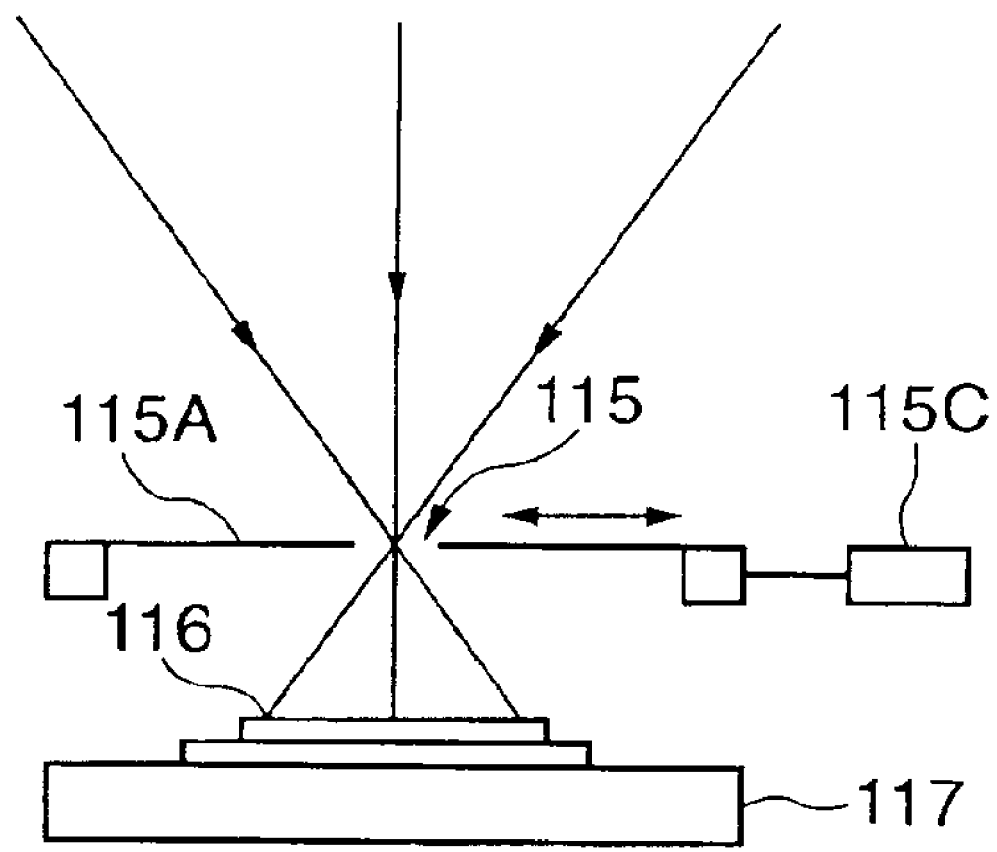
FIG. 23, is a partial, enlarged view showing the second transmission portion and light intensity distribution measurement device.

FIG. 23 is a partial, enlarged view showing the second transmission portion 115 and light intensity distribution measurement device 116.

The second transmission portion 115 and light intensity distribution measurement device 116 are aligned by the wafer stage 117 so as to locate the second transmission portion 115 near the imaging position of the image of the first transmission portion 11. A position on the light intensity measurement surface of the light intensity distribution measurement device 116 has a margin to such a degree a to ensure one-to-one correspondence with a position on the exit pupil of the projection optical system 114. This can be realized by separating the light intensity distribution measurement device 116 from the imaging position of the projection optical system 114 to some extent. This can also be realized by using a pupil imaging optical system.

The light intensity distribution measurement device 116 is constituted such that the device 116 adopts a two-dimensional solid-state image sensing element, each pixel is set as a light-receiving unit, and the total of the sectional areas of beams received by respective light-receiving units satisfactorily covers the pupil area of the pupil of the projection optical system 114.

The operation of the projection exposure apparatus 100 according to the seventh embodiment will be explained.

The second transmission portion 115 scans a plane perpendicular to the optical axis P by the actuator 115C. The light intensity distribution signal processor 116A performs a signal processing based on the above-mentioned principle for changes in light intensity at the respective light-receiving units (pixels) of the light intensity distribution measurement device 116 with respect to the position of the transmission portion 115. Accordingly, ray aberration ($\epsilon(x, y)$, $\eta(x, y)$) can be obtained. Note that (x, y) represents positional coordinates on the light intensity measurement surface D of the light intensity distribution measurement device 116, and coordinates on the exit pupil plane of the projection optical system 114. The signal processor 116A calculates wavefront aberration $\phi(x, y)$, from the obtained ray aberration by:

$$\epsilon(x, y) = R' \cdot (\alpha \phi / \alpha x) \quad (1)$$

$$\eta(x, y) = R' \cdot (\alpha \phi / \alpha y) \quad (2)$$

[Eighth Embodiment]

The eighth embodiment of the present invention will be described with reference to FIG. 24.

Figure 24:
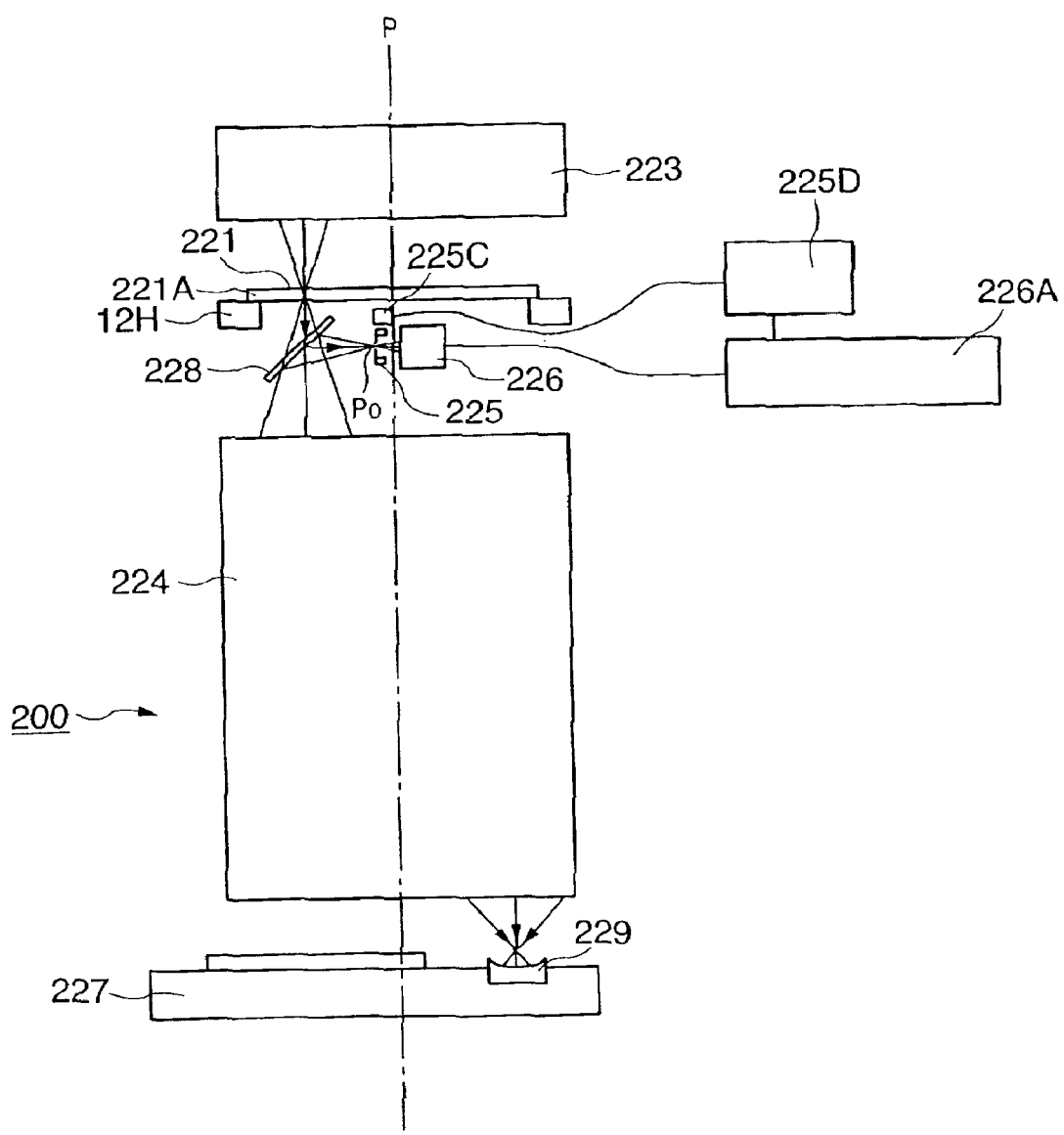
FIG. 24 is a schematic view showing a projection exposure apparatus according to the eighth embodiment of the present invention.

FIG. 24 shows a projection exposure apparatus 200 according to the eighth embodiment of the present invention. The projection exposure apparatus 200 comprises a mask 221A having a first transmission portion 221 for measuring the imaging performance, an auxiliary illumination system 223, a projection optical system 224, a mask 225A having a second transmission portion 225, a light intensity distribution measurement device 226, a wafer stage 227, a deflection optical system 228, and a reflection optical system 229.

The mask 221A has the first transmission portion (optical element) 221 such as a circular aperture.

The auxiliary illumination system 223 is constituted such that an emitted beam passes through the mask 221A having the first transmission portion 221 such as a circular aperture. The auxiliary illumination system 223 is, e.g., an illumination system with σ=1 wherein a beam having passed through the first transmission portion 221 sufficiently covers the entrance pupil of the projection optical system 224.

The projection optical system 224 forms a beam which is emitted by the auxiliary illumination system 223 and passes through the deflection optical system 228, into an image at the center of curvature of the reflection optical system 229 (to be described later).

The mask 225A has the second transmission portion 225 such as an aperture slit. The second transmission portion 225 is movable by an actuator 225C along the z and y directions perpendicular to the optical axis P of the projection optical system 224, which is deflected by the deflection optical system 228. The actuator 225C is controlled by an actuator controller 225D, and the moving amount of the actuator 225C is transferred as data to a signal processor 226A.

Figure 25:
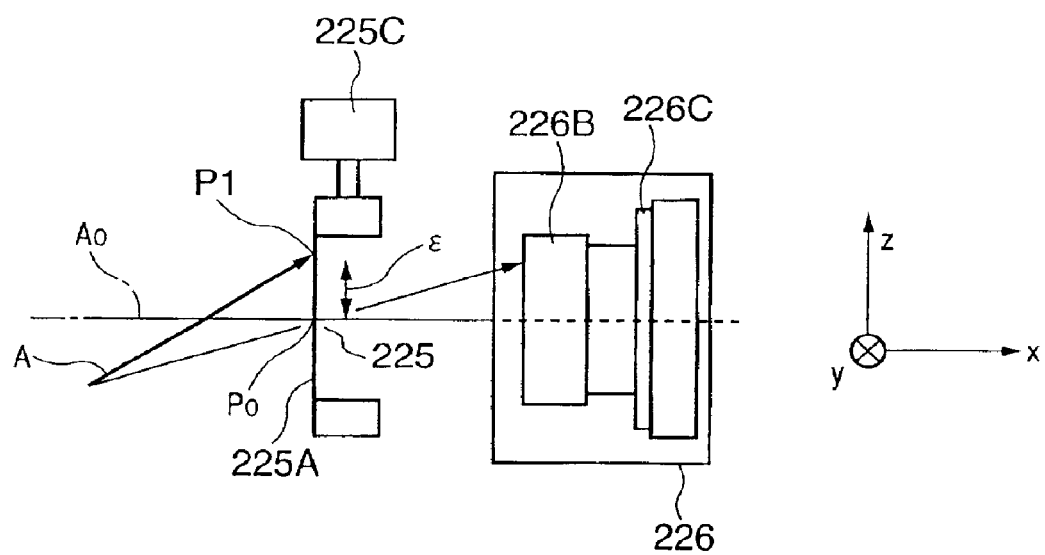
FIG. 25 is a partial, enlarged view showing the transmission portion and light intensity distribution measurement device.

As shown in FIG. 25, the light intensity distribution measurement device 226 comprises a pupil imaging optical system 226B and solid-state image sensing element 226C. The solid-state image sensing element 226C is conjugate to the entrance pupil of the projection optical system 224 via the pupil imaging optical system 226B.

The deflection optical system 228 is formed from a semitransparent member (half-mirror). The deflection optical system 228 changes the optical path of a beam which is reflected by the reflection optical system 229 (to be described below) and passes through the projection optical system 224 again. The beam forms the image of the first transmission portion 221 on the deflected optical path, and passes through the second transmission portion 225 such as an aperture slit of the mask 225A arranged near the image. The beam having passed through the second transmission portion 225 reaches the light intensity measurement surface of the light intensity distribution measurement device 226 where the light intensity is measured.

The reflection optical system 229 is formed from a spherical mirror arranged to make the center of curvature coincide with the imaging position of the beam which emerges from the first transmission portion 221, passes through the projection optical system 224, and forms an image. After the beam is reflected by the reflection optical system 229, it passes through the projection optical system 224 again and forms an image near the second transmission portion 225.

The operation of the projection exposure apparatus according to the eighth embodiment will be explained with reference to FIG. 25.

FIG. 25 is a partial, enlarged view showing the second transmission portion 225 and light intensity distribution measurement device 226.

The actuator 225C moves the second transmission 225 in the −z to +z directions in FIG. 25 such that a beam having passed through the projection optical system 224 twice (reciprocated beam) passes through an ideal imaging point P0 of the image of the first transmission portion 221. In scan, a principal ray Ao having passed through the center of the pupil of the projection optical system 224 passes the second transmission portion 225 while the upper end of the aperture slit serving as the second transmission portion 225 crosses the ideal imaging position Po and its lower end crosses the ideal imaging position Po. The light intensity of the beam is observed by the light intensity distribution measurement device 226.

Figure 26A:
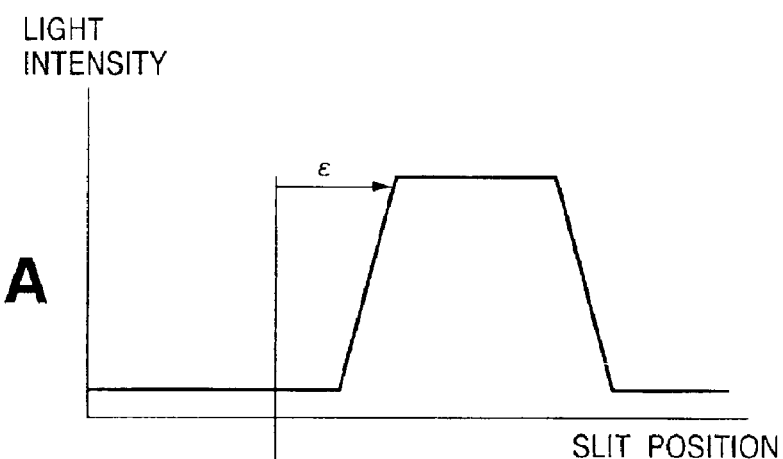
Figure 26B:
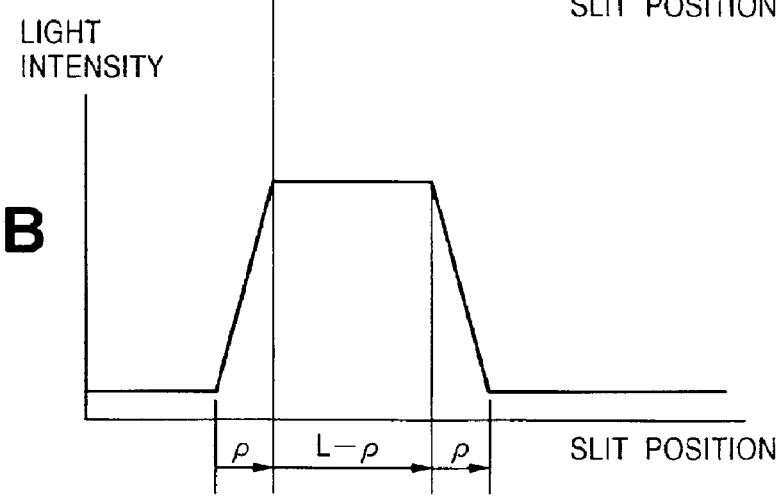

The light intensity distribution along with slit scan is shown as a graph by plotting the slit position on the abscissa and the light intensity on the ordinate, resulting in FIG. 26B. The light intensity as a function of the slit position is obtained only during a period corresponding to a slit width L and a diameter ρ of the circular aperture image of the first transmission portion 221.

A ray A having transverse aberration $\epsilon$ in the z direction in FIG. 25 will be considered. This ray A passes through a position P1 apart from th ideal imaging plane by $\epsilon$ in the z direction. The ray A, therefore, passes through the aperture slit while the upper end of the aperture slit as the second transmission portion 225 crosses P1 and its lower end crosses P1. In the light intensity distribution as a function of the slit position at this time, the light intensity shape shifts by $\epsilon$ from the light intensity distribution of the principal ray Ao, as shown in FIG. 26A.

In this manner, the shift amount of the light intensity shape for the principal ray Ao corresponds to the transverse aberration amount. The light intensity distribution measurement device 226 can measure the transverse aberration amount of the entire pupil plane in the z direction by obtaining changes in light intensity with respect to the position of the second transmission portion 225 and measuring the shift amount of the light intensity shape between the principal ray Ao and each pupil point. Similarly, the light intensity distribution measurement device 226 can measure transverse aberration η in the y direction by moving the second transmission portion 225 in the y direction. Note that the aperture slit in scan in the y direction is much longer in the y direction.

The obtained transverse aberration amount ($\epsilon$, η) in the z and y directions are measured on the reticle side. Since the beam has passed through the projection optical system 224 twice, the relationship with wavefront aberration $\phi$ of the projection optical system 224 satisfies $$\epsilon = -(1/NAo) \cdot [\partial(2\phi)/\partial x] \quad (17)$$

$$\eta = -(1/NAo) \cdot [\partial(2\phi)/\partial y] \quad (18)$$

where NAo is the numerical aperture of the projection optical system 224 on the reticle side, and x and y are coordinates on the entrance pupil and are values normalized by the pupil diameter.

The wavefront aberration $\phi$ of the projection optical system 224 can be obtained by measuring the transverse aberration amounts ($\epsilon$, η) in the x and y directions for the entire pupil plane by using equations (17) and (18) described above.

In the eighth embodiment, the measured transverse aberration amounts ($\epsilon$, η) receive the doubled influence of the wavefront aberration $\phi$ of the projection optical system 224, and NA on the reticle side is smaller than NA on the wafer side. Hence, the transverse aberration is larger than that measured in the seventh embodiment.

For example, the reduction magnification of the projection optical system 224 is 5×. Letting E be the transverse aberration amount measured in the seventh embodiment and $\epsilon$ be the transverse aberration amount measured in the eighth embodiment, from equations (1) and (17) their ratio is:

$$\epsilon/E = 2 \cdot (NAi/Na0) = 10 \quad (19)$$

In the eighth embodiment, a transverse aberration amount ten times that in the seventh embodiment is observed, and the measurement precision of the wavefront aberration $\phi$ greatly increases. Note that NAi is the numerical aperture of the projection optical system 224 on the wafer side, and calculation of equation (19) exploits the reduction magnification of the projection optical system 224:

$$(NAi/NAo) = 5.$$

In the eighth embodiment, the angle of a beam having passed through a single pupil point is smaller on the reticle side than the wafer side, so that the arrangement of the pupil imaging optical system 226B in the light intensity distribution measurement device 226 can be simplified.

[Ninth Embodiment]

The ninth embodiment of the present invention will be described with reference to FIGS. 27 and 28.

Figure 27:
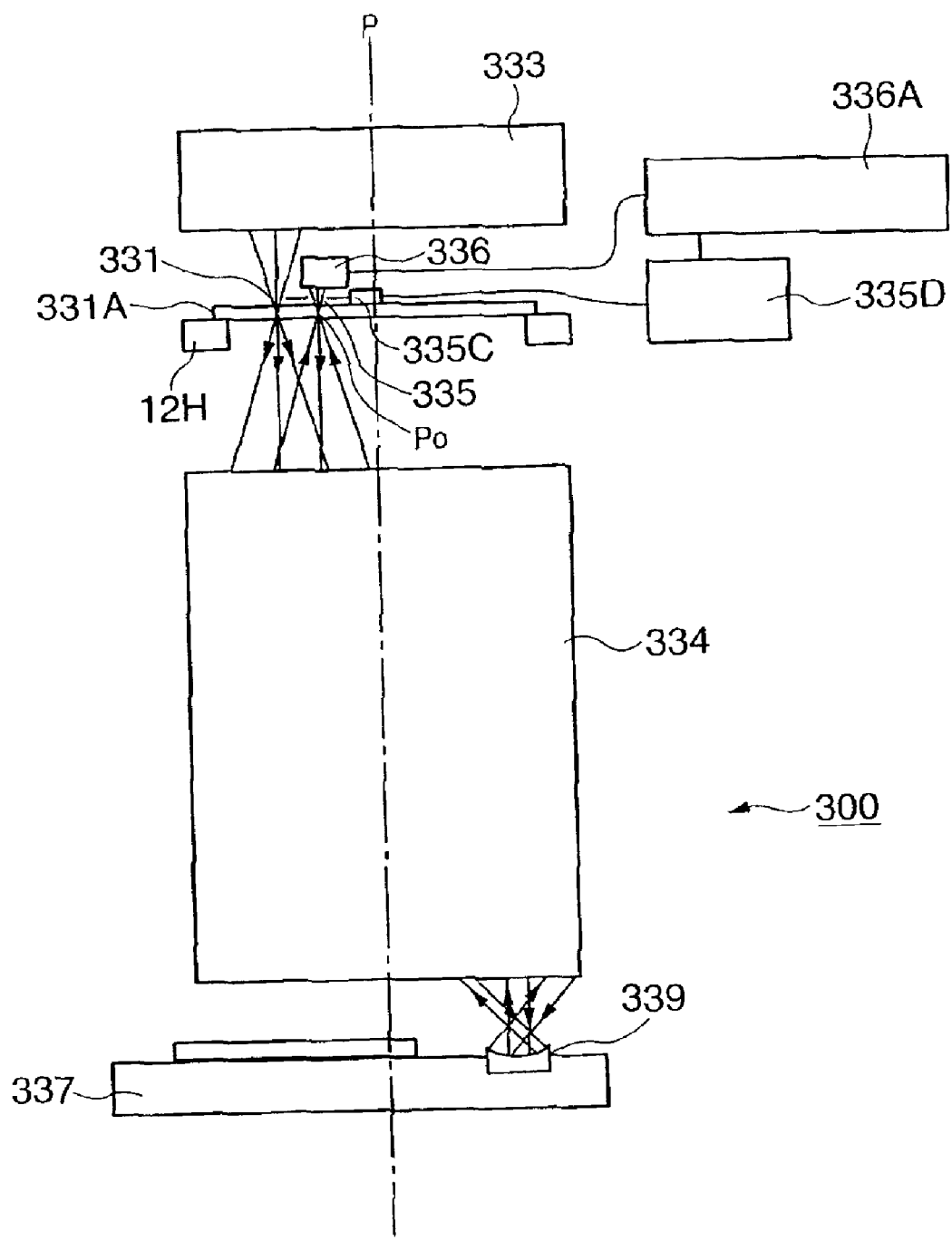
FIG. 27 is a schematic view showing a projection exposure apparatus according to the ninth embodiment of the present invention.

FIG. 27 shows a projection exposure apparatus 300 according to the ninth embodiment of the present invention. Similar to the eighth embodiment, the projection exposure apparatus 300 comprises a mask 331A having a first transmission portion 331, an auxiliary illumination system 333, a projection optical system 334, a mask (e.g., common to 331A) having a second transmission portion 335, a wafer stage 337, a reflection optical system 339, and a light intensity distribution measurement device 336.

The reflection optical system 339 uses a spherical mirror identical to that of the eighth embodiment. The center of curvature of the spherical mirror is decentered in a direction perpendicular to an optical axis P near the imaging position of the first transmission portion 331. The image of the first transmission portion 331, which is reflected by the reflection optical system 339 and passes through the projection optical system 334, again is formed at a position deviated from the first transmission portion 331 in a direction perpendicular to the optical axis P.

Figure 28:
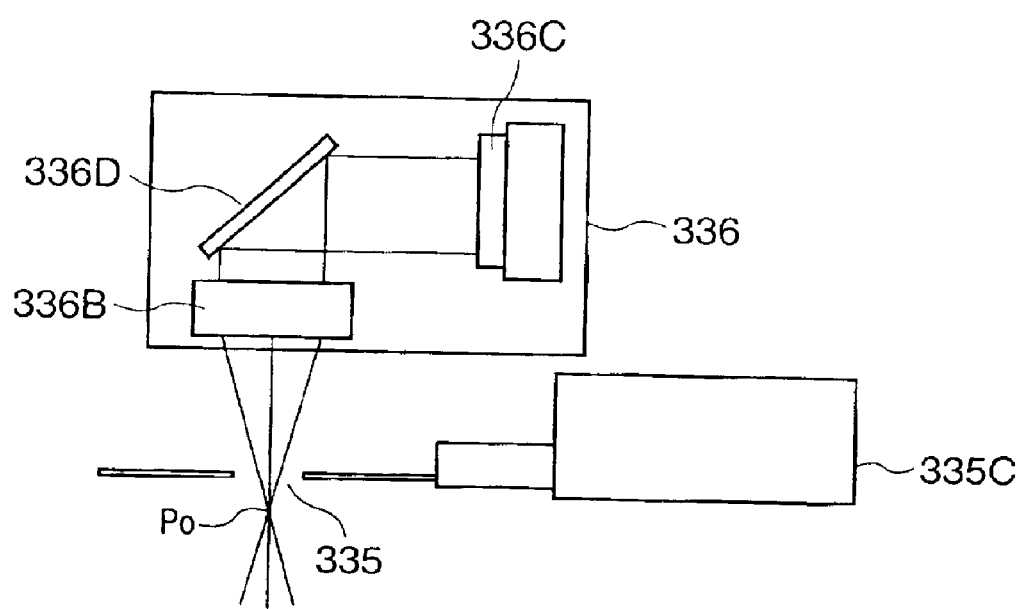
FIG. 28 is an enlarged view showing the main part of the projection exposure apparatus according to the ninth embodiment of the present invention.

As shown in FIG. 28, which is an enlarged view of the main part in FIG. 27, the light intensity distribution measurement device 336 comprises a reflecting mirror 336D in addition to a pupil imaging optical system 336B and solid-state image sensing element 336C. The solid-state image sensing element 336C is conjugate to the entrance pupil of the projection optical system 334 via the pupil imaging optical system 336B.

Also, in the ninth embodiment, the second mask having the second transmission portion 335 such as a slit at an ideal imaging position Po is scanned, and the light intensity distribution measurement device 336 measures the light intensity distribution. The ninth embodiment is smaller in light quantity loss than the eighth embodiment because of the absence of the semitransparent optical axis deflection optical system 228.

[Tenth Embodiment]

The tenth embodiment of the present invention will be described with reference to FIG. 29.

Figure 29:
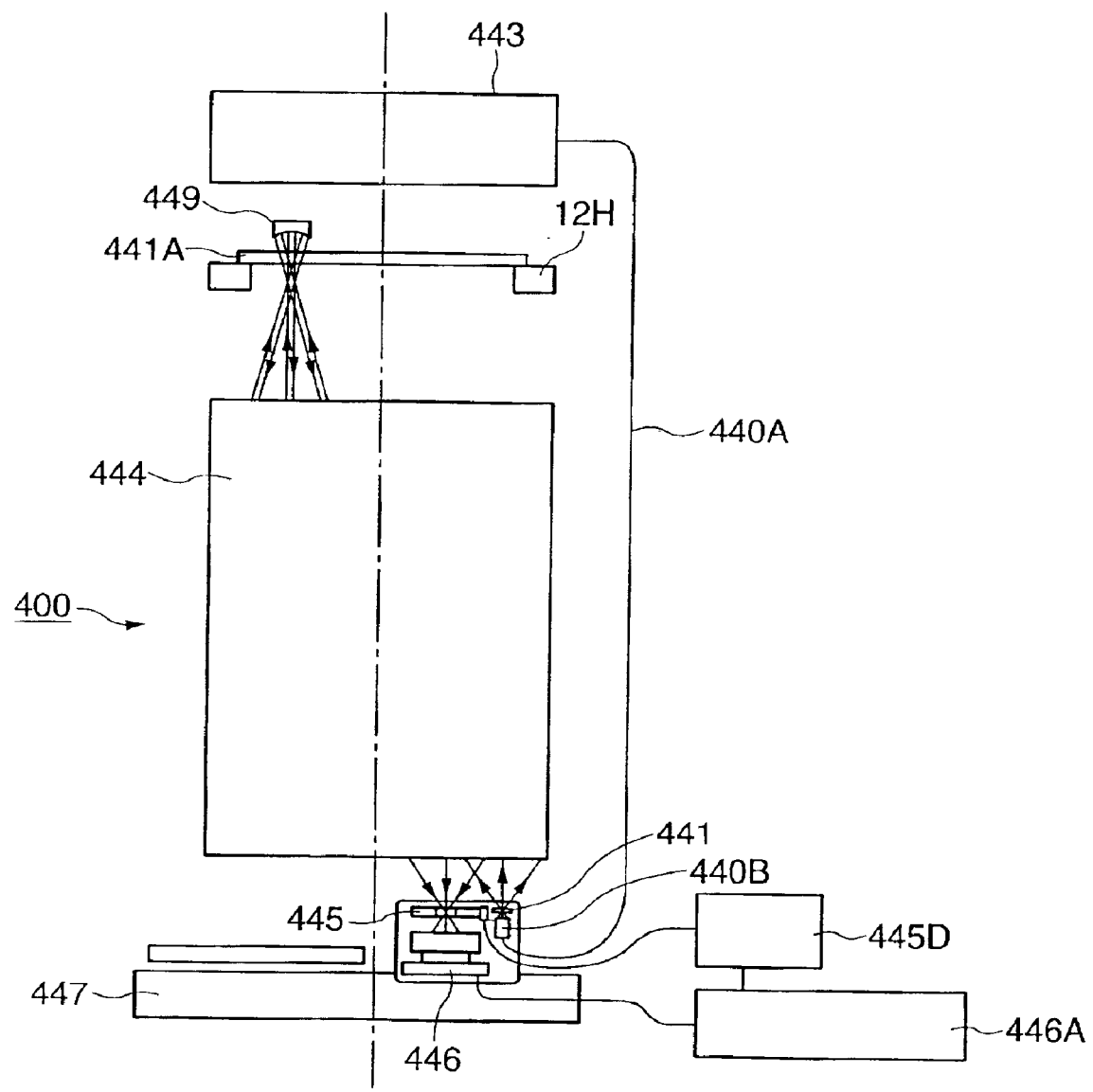
FIG. 29 is a schematic view showing a projection exposure apparatus according to the tenth embodiment of the present invention.

In the tenth embodiment, shown in FIG. 29, a projection exposure apparatus 400 comprises a mask 441 having a first transmission portion, a mask 441A, an auxiliary illumination system 443, a projection optical system 444, a mask 445 having a second transmission portion (scan pattern), a light intensity distribution measurement device 446, a wafer stage 447, a reflection optical system 449, a guide optical system 440A, and a light output system 440B for outputting a beam propagating through the guide optical system 440A.

In the tenth embodiment, the first mask 441 having the first transmission portion such as a circular aperture and the second mask 445 having the second transmission portion are arranged on the wafer stage 447. The reflection optical system 449 has the center of curvature near the mask 441A and is decentered from the optical axis of the projection optical system 444.

The guide optical system 440A guides a beam from the auxiliary illumination system 443 to the wafer side, and uses a light propagation means such as an optical fiber.

The light output system 440B is equipped with the mask 441 having the first transmission portion such as a circular aperture, and outputs a beam guided by the guide optical system 440A toward the projection optical system 444 via the transmission portion.

According to the tenth embodiment, a beam which passes through the transmission portion of the mask 441 and the projection optical system 444 is reflected by the reflection optical system 449. The light which is reflected by the reflection optical system 449 and passes through the projection optical system 444 again forms an image in a plane which is perpendicular to the optical axis of the projection optical system 444 and coincides with the mask 441 having the transmission portion. The imaging beam scans the mask 445 having the second transmission portion, and the light intensity distribution is measured by the light intensity distribution measurement device 446. A signal processor 446A processes the position of the second transmission portion of the second mask 445 and the light intensity distribution, thereby measuring the aberration of the projection optical system 444.

[Semiconductor Device Manufacturing Method]

An embodiment of a semiconductor device manufacturing method using the above-described projection exposure apparatus will be explained.

FIG. 30 is a flow chart for explaining the manufacture of a semiconductor device (e.g., a semiconductor chip such as an IC or LSI, a liquid crystal panel, a CCD, or the like). In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly), called a post-process, is the step of forming a semiconductor chip by using the wafer formed in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7).

Figure 31:
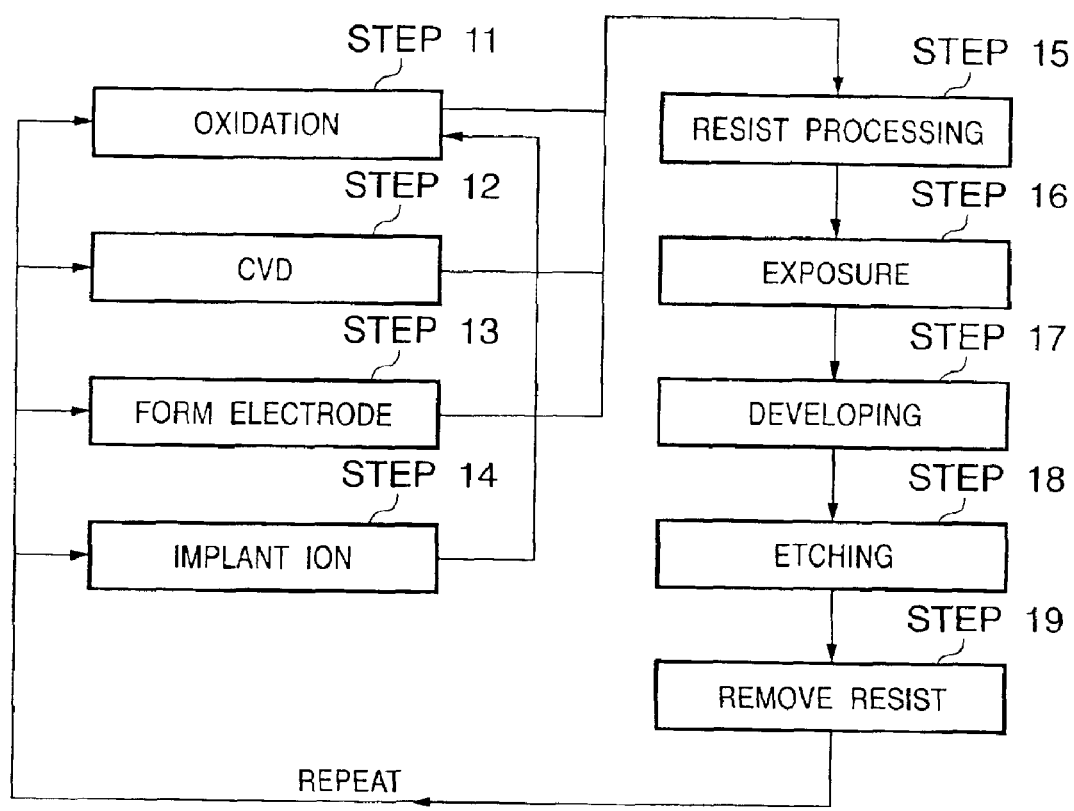
FIG. 31 is a flow chart showing a wafer process.

FIG. 31 is a flow chart showing the wafer process in step 4 of FIG. 30 in detail. In step 11 (oxidation), the wafer surface is oxidized. In step 12 (CVD), an insulating the film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of this embodiment can manufacture a high-precision semiconductor device, which is difficult to manufacture by a conventional method.

As has been described above, the present invention realizes measurement of the wavefront aberration of a projection optical system in a state in which the projection optical system can be actually used for exposure. The present invention enables more precise adjustment of the projection optical system and the design of a device, which is hardly influenced by aberration.

As many apparently widely different embodiments of the present invention can be made without departing from the spirit and scope thereof, it is to be understood that the invention is not limited to the specific embodiments except as defined in the claims.

What is claimed is:

1. A projection exposure apparatus comprising:

a projection optical system arranged to project a pattern onto a substrate;

a holding portion arranged to hold an optical element which emits light toward said projection optical system;

a mask having a transmission portion and being disposed on or near a plane of an image of said optical element formed by said projection optical system;

an actuator arranged to drive said mask along the plane of the image of said optical element;

a measurement device arranged to measure an intensity of light while said mask is driven, the light emerging from said optical element, and passing through said projection optical system and the transmission portion of said mask, said measurement device including a measurement surface positioned at a plane spaced apart from said mask enough to separately detect respective rays emerging from plural points of a pupil plane of said projection optical system and passing through the transmission portion; and a device arranged to calculate aberration of said projection optical system on the basis of a measurement result of said measurement device.

2. The apparatus according to claim 1, wherein the aberration is ray aberration of said projection optical system.

3. The apparatus according to claim 1, wherein the aberration is wavefront aberration of said projection optical system.

4. The apparatus according to claim 1, wherein said optical element is arranged near the object plane of said projection optical system, and said mask is arranged near the image plane of said projection optical system.

5. The apparatus according to claim 4, wherein said optical element includes a mask having a transmission portion, and light is emitted toward said projection optical system by illuminating said mask serving as said optical element by an illumination system.

6. The apparatus according to claim 1, wherein said optical element is arranged near the image plane of said projection optical system, and said mask is arranged near the object plane of said projection optical system.

7. The apparatus according to claim 6, wherein said optical element includes a mask having a transmission portion, and light is emitted toward said projection optical system by illuminating said mask serving as said optical element by an illumination system.

8. The apparatus according to claim 6, wherein the projection exposure apparatus further comprises an illumination system, said optical element includes a reflecting member, and said reflecting member reflects, toward said projection optical system, light which is emitted by said illumination system and is incident on said reflecting member via said projection optical system.

9. The apparatus according to claim 8, further comprising a reflecting mirror for deflecting light which emerges from said optical element and passes through said projection optical system, and guiding the light to said mask.

10. The apparatus according to claim 1, wherein said optical element is arranged near the object plane of said projection optical system, said mask is arranged near a plane conjugate to the object plane of said projection optical system, the projection exposure apparatus further comprises a first reflecting mirror arranged on the image plane side of said projection optical system, and a second reflecting mirror for reflecting, toward said measurement devices, light which is reflected by said first reflecting mirror and passes through said projection optical system, and light which emerges from said optical element passes through said projection optical system, is reflected by said first reflecting mirror, passes through said projection optical system again, is reflected by said second reflecting mirror, and guided to said mask.

11. The apparatus according to claim 1, wherein said optical element and said mask are arranged near the object plane of said projection optical system, the projection exposure apparatus further comprises a reflecting mirror arranged on the image plane side of said projection optical system, and light which emerges from said optical element passes through said projection optical system, is reflected by said reflecting mirror, passes through said projection optical system again, and is guided to said mask.

12. The apparatus according to claim 1, wherein said optical element and said mask are arranged near the image plane of said projection optical system, the projection exposure apparatus further comprises a reflecting mirror arranged on the object plane side of said projection optical system, and light which emerges from said optical element passes through said projection optical system, is reflected by said reflecting mirror, passes through said projection optical system again, and is guided to said mask.

13. The apparatus according to claim 1, wherein a predetermined region near the image plane or object plane of said projection optical system falls within an isoplanatic region of said projection optical system.

14. The apparatus according to claim 1, wherein light which emerges from a predetermined region near the image plane or object plane of said projection optical system sufficiently covers a pupil of said projection optical system.

15. The apparatus according to claim 1, wherein the measurement surface is positioned at a plane conjugate to the pupil plane of said projection optical system.

16. A projection exposure apparatus comprising:

an illumination system;

a projection optical system for projecting a pattern on a substrate;

a holding portion for holding a first mask having a first transmission portion between said illumination system and said projection optical system;

a second mask which is arranged near an image-side focal position of said projection optical system and has a second transmission portion;

an actuator for driving said second mask along an image plane of said projection optical system; and a measurement device for measuring a change in intensity of light which is emitted by said illumination system and passes through the first transmission portion, said projection optical system, and the second transmission portion while said second mask is driven.

17. The apparatus according to claim 16, further comprising an arithmetic device for calculating aberration of said projection optical system on the basis of a measurement result of said measurement device.

18. The apparatus according to claim 16, further comprising an arithmetic device for calculating ray aberration of said projection optical system on the basis of a measurement result of said measurement device.

19. The apparatus according to claim 16, further comprising an arithmetic device for calculating wavefront aberration of said projection optical system on the basis of a measurement result of said measurement device.

20. The apparatus according to claim 16, further comprising an imaging optical system for imaging an exit pupil of said projection optical system on a measurement surface of said measurement device.

21. The apparatus according to claim 20, wherein said actuator drives said measurement device and said imaging optical system together with said second mask.

22. The apparatus according to claim 20, wherein said second mask, said imaging optical system, and said measurement device constitute an integral measurement unit, and said actuator drives said measurement unit along the image plane of said projection optical system.

23. The apparatus according to claim 16, wherein said first mask has a plurality of first transmission portions.

24. The apparatus according to claim 16, wherein said first mask has a transfer pattern to be transferred to the substrate, in addition to the first transmission portion.

25. A projection exposure apparatus comprising:

an illumination system;

a projection optical system for projecting a pattern on a substrate;

a first holding portion for holding a first mask having a first transmission portion between said illumination system and said projection optical system;

a first reflecting mirror arranged on an image plane side of said projection optical system;

a second mask which is arranged between said illumination system and said projection optical system and has a second transmission portion;

a second reflecting mirror for deflecting, toward the second transmission portion, light which is emitted by said illumination system, passes through the first transmission portion and said projection optical system, is reflected by said first reflecting mirror, and passes through said projection optical system again;

an actuator for driving said second mask in a predetermined plane; and a measurement device for measuring an intensity of light which is emitted by said illumination system, passes through the first transmission portion of said first mask and said projection optical system, is reflected by said first reflecting mirror, passes through said projection optical system again, is reflected by said second reflecting mirror, and passes through the second transmission portion of said second mask while said second mask is driven.

26. The apparatus according to claim 25, further comprising an arithmetic device for calculating aberration of said projection optical system on the basis of a measurement result of said measurement device.

27. The apparatus according to claim 25, further comprising an arithmetic device for calculating ray aberration of said projection optical system on the basis of a measurement result of said measurement device.

28. The apparatus according to claim 25, further comprising an arithmetic device for calculating wavefront aberration of said projection optical system on the basis of a measurement result of said measurement device.

29. The apparatus according to claim 25, wherein said first reflecting mirror includes a spherical mirror.

30. The apparatus according to claim 25, wherein said second reflecting mirror includes a half-mirror which transmits light emitted by said illumination system toward said projection optical system, and reflects, toward the second transmission portion of said second mask, light which is reflected by said first reflecting mirror and passes through said projection optical system.

31. A projection exposure apparatus comprising:

an illumination system;

a projection optical system for projecting a pattern on a substrate;

a holding portion for holding a first mask having a first transmission portion between said illumination system and said projection optical system;

a second mask which is arranged near an object plane of said projection optical system and has a second transmission portion;

a reflecting mirror arranged on an image plane side of said projection optical system, light which is emitted by said illumination system, passes through the first transmission portion and said second projection optical system, is reflected by said reflecting mirror, and passes through said projection optical system again being incident on the second transmission portion;

an actuator for driving said second mask along the object plane of said projection optical system; and a measurement device for measuring an intensity of light which is emitted by said illumination system, passes through the first transmission portion and said projection optical system, is reflected by said reflecting mirror, passes through said projection optical system again, and passes through the second transmission portion while said second mask is driven.

32. The apparatus according to claim 31, further comprising an arithmetic device for calculating aberration of said projection optical system on the basis of a measurement result of said measurement device.

33. The apparatus according to claim 31, further comprising an arithmetic device for calculating ray aberration of said projection optical system on the basis of a measurement result of said measurement device.

34. The apparatus according to claim 31, further comprising an arithmetic device for calculating wavefront aberration of said projection optical system on the basis of a measurement result of said measurement device.

35. The apparatus according to claim 31, wherein said reflecting mirror includes a spherical mirror.

36. A projection exposure apparatus comprising:

a substrate stage;

a projection optical system for projecting a pattern on a substrate on said substrate stage;

a first mask which is arranged between said projection optical system and said substrate stage and has a first transmission portion;

an illumination system for illuminating the first transmission portion;

a second mask which is arranged between said projection optical system and said substrate stage and has a second transmission portion;

a reflecting mirror arranged on an object side of said projection optical system, light which is emitted by said illumination system, passes through the first transmission portion and said projection optical system, is reflected by said reflecting mirror, and passes through said projection optical system again being incident on the second transmission portion;

an actuator for driving said second mask along an image plane of said projection optical system; and a measurement device for measuring an intensity of light which is emitted by said illumination system, passes through the first transmission portion and said projection optical system, is reflected by said reflecting mirror, passes through said projection optical system again, and passes through the second transmission portion while said second mask is driven.

37. The apparatus according to claim 36, further comprising an arithmetic device for calculating aberration of said projection optical system on the basis of a measurement result of said measurement device.

38. The apparatus according to claim 36, further comprising an arithmetic device for calculating ray aberration of said projection optical system on the basis of a measurement result of said measurement device.

39. The apparatus according to claim 36, further comprising an arithmetic device for calculating wavefront aberration of said projection optical system on the basis of a measurement result of said measurement device.

40. The apparatus according to claim 36, wherein said reflecting mirror includes a spherical mirror.

41. A method of measuring aberration of a projection optical system in a projection exposure apparatus for projecting a pattern on a substrate via the projection optical system, the projection exposure apparatus having
a projection optical system for projecting a pattern on a substrate,
a holding portion for holding an optical element which propagates light toward the projection optical system, and
a mask which is arranged near an image plane or object plane of the projection optical system or a plane conjugate to the image plane and object plane and has a transmission portion, the method comprising:
the measurement step of measuring an intensity of light which emerges from the optical element, and passes through the projection optical system and the transmission portion of the mask while the mask is driven along a plane of an image of the optical element formed by the projection optical system; and
the arithmetic step of calculating aberration of the projection optical system on the basis of a measurement result obtained in the measurement step.

42. A method of measuring aberration of a projection optical system in a projection exposure apparatus for projecting a pattern on a substrate via the projection optical system, the projection exposure apparatus having
an illumination system,
a projection optical system for projecting a pattern on a substrate,
a holding portion for holding a first mask having a first transmission portion between the illumination system and the projection optical system, and
a second mask which is arranged near an image-side focal position of the projection optical system and has a second transmission portion, the method comprising:
the measurement step of measuring a change in intensity of light which is emitted by the illumination system and passes through the first transmission portion, the projection optical system, and the second transmission portion while the second mask is driven along an image plane of the projection optical system; and
the arithmetic step of calculating aberration of the projection optical system on the basis of a measurement result obtained in the measurement step.

43. A method of measuring aberration of a projection optical system in a projection exposure apparatus for projecting a pattern on a substrate via the projection optical system, the projection exposure apparatus having
an illumination system,
a projection optical system for projecting a pattern on a substrate,
a first holding portion for holding a first mask having a first transmission portion between the illumination system and the projection optical system;
a first reflecting mirror arranged on an image plane side of the projection optical system,
a second mask which is arranged between the illumination system and the projection optical system and has a second transmission portion, and
a second reflecting mirror for deflecting, toward the second transmission portion, light which is emitted by the illumination system, passes through the first transmission portion and the projection optical system, is reflected by the first reflecting mirror, and passes through the projection optical system again, the method comprising:
the measurement step of measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane; and
the arithmetic step of calculating aberration of the projection optical system on the basis of a measurement result obtained in the measurement step.

44. A method of measuring aberration of a projection optical system in a projection exposure apparatus for projecting a pattern on a substrate via the projection optical system, the projection exposure apparatus having
an illumination system,
a projection optical system for projecting a pattern on a substrate,
a holding portion for holding a first mask having a first transmission portion between the illumination system and the projection optical system,
a second mask which is arranged near an object plane of the projection optical system and has a second transmission portion, and
a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion, the method comprising:
the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along the object plane of the projection optical system; and
the arithmetic step of calculating aberration of the projection optical system on the basis of a measurement result obtained in the measurement step.

45. A method of measuring aberration of a projection optical system in a projection exposure apparatus for projecting a pattern on a substrate via the projection optical system,
the projection exposure apparatus having
a substrate stage,
a projection optical system for projecting a pattern on a substrate on the substrate stage,
a first mask which is arranged between the projection optical system and the substrate stage and has a first transmission portion,
an illumination system for illuminating the first transmission portion,
a second mask which is arranged between the projection optical system and the substrate stage and has a second transmission portion, and
a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion,
the method comprising:
the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system; and
the arithmetic step of calculating aberration of the projection optical system on the basis of a measurement result obtained in the measurement step.

46. A transfer method of transferring a pattern to a substrate by using a projection exposure apparatus,
the projection exposure apparatus having
a projection optical system for projecting a pattern on a substrate,
a holding portion for holding an optical element which propagates light toward the projection optical system, and
a mask which is arranged near an image plane or object plane of the projection optical system or a plane conjugate to the image plane and object plane and has a transmission portion,
the method comprising:
the measurement step of measuring an intensity of light which emerges from the optical element, and passes through the projection optical system and the transmission portion of the mask while the mask is driven along a plane of an image of the optical element formed by the projection optical system;
the arithmetic step of calculating aberration of the projection optical system on the basis of a measurement result obtained in the measurement step;
the adjustment step of adjusting the projection optical system on the basis of aberration obtained in the arithmetic step; and
the transfer step of transferring a pattern to the substrate by using the projection exposure apparatus in which the projection optical system is adjusted.

47. A transfer method of transferring a pattern to a substrate by using a projection exposure apparatus,
the projection exposure apparatus having
an illumination system,
a projection optical system for projecting a pattern on a substrate,
a holding portion for holding a first mask having a first transmission portion between the illumination system and the projection optical system, and
a second mask which is arranged near an image-side focal position of the projection optical system and has a second transmission portion,
the method comprising:
the measurement step of measuring a change in intensity of light which is emitted by the illumination system and passes through the first transmission portion, the projection optical system, and the second transmission portion while the second mask is driven along an image plane of the projection optical system;
the arithmetic step of calculating aberration of the projection optical system on the basis of a measurement result obtained in the measurement step; and
the transfer step of transferring a pattern to the substrate by using the projection exposure apparatus in which the projection optical system is adjusted.

48. A transfer method of transferring a pattern to a substrate by using a projection exposure apparatus,
the projection exposure apparatus having
an illumination system,
a projection optical system for projecting a pattern on a substrate,
a first holding portion for holding a first mask having a first transmission portion between the illumination system and the projection optical system,
a first reflecting mirror arranged on an image plane side of the projection optical system,
a second mask which is arranged between the illumination system and the projection optical system and has a second transmission portion, and
a second reflecting mirror for deflecting, toward the second transmission portion, light which is emitted by the illumination system, passes through the first transmission portion and the projection optical system, is reflected by the first reflecting mirror, and passes through the projection optical system again,
the method comprising:
the measurement step of measuring an intensity of light which is emitted by the illumination system, passes through a first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane;
the arithmetic step of calculating aberration of the projection optical system on the basis of a measurement result obtained in the measurement step;
the adjustment step of adjusting the projecting optical system on the basis of aberration obtained in the arithmetic step; and the transfer step of transferring a pattern to the substrate by using the projection exposure apparatus in which the projection optical system is adjusted.

49. A transfer method of transferring a pattern to a substrate by using a projection exposure apparatus, the projection exposure apparatus having
an illumination system,
a projection optical system for projecting a pattern on a substrate,
a holding portion for holding a first mask having a first transmission portion between the illumination system and the projection optical system,
a second mask which is arranged near an object plane of the projection optical system and has a second transmission portion, and
a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion, the method comprising:
the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along the object plane of the projection optical system;
the arithmetic step of calculating aberration of the projection optical system on the basis of a measurement result obtained in the measurement step;
the adjustment step of adjusting the projection optical system on the basis of aberration obtained in the arithmetic step; and
the transfer step of transferring a pattern to the substrate by using the projection exposure apparatus in which the projection optical system is adjusted.

50. A transfer method of transferring a pattern to a substrate by using a projection exposure apparatus, the projection exposure apparatus having
a substrate stage,
a projection optical system for projecting a pattern on a substrate on the substrate stage,
a first mask which is arranged between the projection optical system and the substrate stage and has a first transmission portion,
an illumination system for illuminating the first transmission portion,
a second mask which is arranged between the projection optical system and the substrate stage and has a second transmission portion, and
a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion, the method comprising:
the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system;
the arithmetic step of calculating aberration of the projection optical system on the basis of a measurement result obtained in the measurement step;
the adjustment step of adjusting the projection optical system on the basis of aberration obtained in the arithmetic step; and
the transfer step of transferring a pattern to the substrate by using the projection exposure apparatus in which the projection optical system is adjusted.

51. A method of manufacturing a device by using a projection exposure apparatus, the projection exposure apparatus having
a projection optical system for projecting a pattern on a substrate,
a holding portion for holding an optical element which propagates light toward the projection optical system, and
a mask which is arranged near an image plane or object plane of the projection optical system or a plane conjugate to the image plane and object plane and has a transmission portion, the method comprising:
the measurement step of measuring an intensity of light which emerges from the optical element, and passes through the projection optical system and the transmission portion of the mask while the mask is driven along a plane of an image of the optical element formed by the projection optical system;
the arithmetic step of calculating aberration of the projection optical system on the basis of a measurement result obtained in the measurement step;
the adjustment step of adjusting the projection optical system on the basis of the aberration obtained in the arithmetic step;
the transfer step of transferring a pattern to a photosensitive member of the substrate coated with the photosensitive member by using the projection exposure apparatus in which the projection optical system is adjusted; and
the developing step of developing the photosensitive member bearing the pattern.

52. A method of manufacturing a device by using a projection exposure apparatus, the projection exposure apparatus having
an illumination system,
a projection optical system for projecting a pattern on a substrate,
a holding portion for holding a first mask having a first transmission portion between the illumination system and the projection optical system, and
a second mask which is arranged near an image-side focal position of the projection optical system and has a second transmission portion, the method comprising:
the measurement step of measuring a change in intensity of light which is emitted by the illumination system and passes through the first transmission portion, the projection optical system, and the second transmission portion while the second mask is driven along an image plane of the projection optical system;
the arithmetic step of calculating aberration of the projection optical system on the basis of a measurement result obtained in the measurement step;
the adjustment step of adjusting the projection optical system on the basis of the aberration obtained in the arithmetic step;
the transfer step of transferring a pattern to a photosensitive member of the substrate coated with the photosensitive member by using the projection exposure apparatus in which the projection optical system is adjusted; and the developing step of developing the photosensitive member bearing the pattern.

53. A method of manufacturing a device by using a projection exposure apparatus, the projection exposure apparatus having
an illumination system,
a projection optical system for projecting a pattern on a substrate,
a first holding portion for holding a first mask having a first transmission portion between the illumination system and the projection optical system,
a second mask which is arranged between the illumination system and the projection optical system and has a second transmission portion, and
a second reflecting mirror for deflecting, toward the second transmission portion, light which is emitted by the illumination system, passes through the first transmission portion and the projection optical system, is reflected by the first reflecting mirror, and passes through the projection optical system again, the method comprising:
the measurement step of measuring an intensity of light which is emitted by the illumination system, passes through the first transmission portion of the first mask and the projection optical system, is reflected by the first reflecting mirror, passes through the projection optical system again, is reflected by the second reflecting mirror, and passes through the second transmission portion of the second mask while the second mask is driven in a predetermined plane;
the arithmetic step of calculating aberration of the projection optical system on the basis of a measurement result obtained in the measurement step;
the adjustment step of adjusting the projection optical system on the basis of the aberration obtained in the arithmetic step;
the transfer step of transferring a pattern to a photosensitive member of the substrate coated with the photosensitive member by using the projection exposure apparatus in which the projection optical system is adjusted; and
the developing step of developing the photosensitive member bearing the pattern.

54. A method of manufacturing a device by using a projection exposure apparatus, the projection exposure apparatus having
an illumination system,
a projection optical system for projecting a pattern on a substrate,
a holding portion for holding a first mask having a first transmission portion between the illumination system and the projection optical system,
a second mask which is arranged near an object plane of the projection optical system and has a second transmission portion, and
a reflecting mirror arranged on an image plane side of the projection optical system, light which is emitted by the illumination system, passes through the first transmission portion and the projection optical system, is reflected by the reflecting mirror, and passes through the projection optical system again being incident on the second transmission portion, the method comprising:

the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along the object plane of the projection optical system;
the arithmetic step of calculating aberration of the projection optical system on the basis of a measurement result obtained in the measurement step;
the adjustment step of adjusting the projection optical system on the basis of the aberration obtained in the arithmetic step;
the transfer step of transferring a pattern to a photosensitive member of the substrate coated with the photosensitive member by using the projection exposure apparatus in which the projection optical system is adjusted; and
the developing step of developing the photosensitive member bearing the pattern.

55. A method of manufacturing a device by using a projection exposure apparatus, the projection exposure apparatus having
a substrate stage,
a projection optical system for projecting a pattern on a substrate on the substrate stage,
a first mask which is arranged between the projection optical system and the substrate stage and has a first transmission portion,
an illumination system for illuminating the first transmission portion,
a second mask which is arranged between the projection optical system and the substrate stage and has a second transmission portion, and
a reflecting mirror arranged on an object side of the projection optical system, light which is emitted by the illumination system, passes through the first transmission portion and the projection optical system, is reflected by the reflecting mirror, and passes through the projection optical system again being incident on the second transmission portion, the method comprising:
the measurement step of measuring an intensity of light which is emitted by the illumination system, passes through the first transmission portion and the projection optical system, is reflected by the reflecting mirror, passes through the projection optical system again, and passes through the second transmission portion while the second mask is driven along an image plane of the projection optical system;
the arithmetic step of calculating aberration of the projection optical system on the basis of a measurement result obtained in the measurement step;
the adjustment step of adjusting the projection optical system on the basis of the aberration obtained in the arithmetic step;
the transfer step of transferring a pattern to a photosensitive member of the substrate coated with the photosensitive member by using the projection exposure apparatus in which the projection optical system is adjusted; and
the developing step of developing the photosensitive member bearing the pattern.

* * * * *

UNITED STATES PATENT AND TRADEMARK OFFICE
CERTIFICATE OF CORRECTION

PATENT NO.    : 6,859,264 B2
DATED         : February 22, 2005
INVENTOR(S)   : Akihiro Nakauchi It is certified that error appears in the above-identified patent and that said Letters Patent is hereby corrected as shown below:

Title page,
Item [56], References Cited, OTHER PUBLICATIONS, "Flanders, D.C.," reference, "*Appli d*" should read -- *Applied* --.

Column 17,
Line 46, "apparatus" should read -- apparatus using --.

Column 19,
Line 20, "segment $O_2P_2$) ($\alpha$, $\beta$):" should read -- segment $O_2P_2$) -- and the right margin should be closed up.
Line 21, "aberration" should read -- ($\alpha$, $\beta$): aberration --.

Column 26,
Line 7, the second occurrence of "a" should read -- as --.

Signed and Sealed this

Nineteenth Day of July, 2005

JON W. DUDAS
*Director of the United States Patent and Trademark Office*